(12) United States Patent
Fryer et al.

(10) Patent No.: US 9,601,597 B2
(45) Date of Patent: Mar. 21, 2017

(54) SUBSTANTIALLY PLANAR ELECTRONIC DEVICES AND CIRCUITS

(71) Applicant: Pragmatic Printing Limited, Sedgefield, Durham (GB)

(72) Inventors: Antony Colin Fryer, Northallerton (GB); Richard David Price, Manchester (GB)

(73) Assignee: Pragmatic Printing Limited, Sedgefield Durham (GB)

( * ) Notice: Subject to any disclaimer, the term of this patent is extended or adjusted under 35 U.S.C. 154(b) by 0 days.

(21) Appl. No.: 14/380,199

(22) PCT Filed: Feb. 21, 2013

(86) PCT No.: PCT/GB2013/050416
§ 371 (c)(1),
(2) Date: Aug. 21, 2014

(87) PCT Pub. No.: WO2013/124656
PCT Pub. Date: Aug. 29, 2013

(65) Prior Publication Data
US 2015/0001597 A1    Jan. 1, 2015

(30) Foreign Application Priority Data
Feb. 21, 2012 (GB) .................................. 1202971.6

(51) Int. Cl.
| H01L 29/76 | (2006.01) |
| H01L 27/12 | (2006.01) |
| H01L 51/40 | (2006.01) |
| H01L 21/336 | (2006.01) |
| H01L 29/66 | (2006.01) |

(Continued)

(52) U.S. Cl.
CPC .... *H01L 29/66795* (2013.01); *H01L 27/1288* (2013.01); *H01L 27/1292* (2013.01); *H01L 29/7855* (2013.01); *H01L 29/7869* (2013.01)

(58) Field of Classification Search
CPC ........... H01L 29/66795; H01L 29/7855; H01L 27/1288; H01L 27/1292; H01L 29/7869; H01L 29/00; H01L 21/84; H01L 21/00
USPC ...... 257/288, 59, 40, 351; 438/308, 99, 149, 438/104, 142, 161
See application file for complete search history.

(56) References Cited

U.S. PATENT DOCUMENTS

| 5,315,143 A | 5/1994 | Tsuji |
| 5,622,814 A | 4/1997 | Miyata et al. |
| 5,981,317 A * | 11/1999 | French et al. ................ 438/161 |

(Continued)

FOREIGN PATENT DOCUMENTS

| JP | 63047981 A | 2/1988 |
| WO | WO00/59027 A1 | 10/2000 |

OTHER PUBLICATIONS

International Preliminary Report on Patentability for PCT/GB2013/050416 (mailed Sep. 4, 2014).

(Continued)

*Primary Examiner* — Dzung Tran
(74) *Attorney, Agent, or Firm* — Klarquist Sparkman, LLP

(57) ABSTRACT

A method of manufacturing a substantially planar electronic device is disclosed. The method employs a resist having three different thicknesses used for defining different structures in a single masking step. Exemplary structures are substantially planar transistors having side-gates and diodes.

3 Claims, 46 Drawing Sheets

(51) Int. Cl.
    *H01L 29/78*      (2006.01)
    *H01L 29/786*     (2006.01)

(56) References Cited

U.S. PATENT DOCUMENTS

| | | | |
|---|---|---|---|
| 6,380,009 B1* | 4/2002 | Battersby | 438/161 |
| 6,597,043 B1* | 7/2003 | Naem | 257/387 |
| 2004/0002216 A1 | 1/2004 | Taussig et al. | |
| 2004/0097048 A1* | 5/2004 | Koh | 438/305 |
| 2006/0216872 A1* | 9/2006 | Arai et al. | 438/149 |
| 2006/0221169 A1 | 10/2006 | Holland | |
| 2006/0270057 A1 | 11/2006 | Sharma | |
| 2006/0275963 A1 | 12/2006 | Mei et al. | |
| 2007/0072439 A1* | 3/2007 | Akimoto et al. | 438/795 |
| 2009/0072225 A1* | 3/2009 | Koo et al. | 257/40 |
| 2010/0038644 A1 | 2/2010 | Song et al. | |
| 2010/0176379 A1 | 7/2010 | Kim et al. | |
| 2012/0161123 A1* | 6/2012 | Yamazaki | 257/43 |

OTHER PUBLICATIONS

International Search Report and Written Opinion of the International Searching Authority, mailed Jul. 23, 2013, for corresponding International Application No. PCT/GB2013/050416, 11 pages.
Search Report from the United Kingdom Intellectual Property Office for corresponding Great Britain Application No. GB1202971.6, Jan. 25, 2013, 2 pages.
Search Report from the United Kingdom Intellectual Property Office for corresponding Great Britain Application No. GB1202971.6, Jul. 19, 2012, 3 pages.
Examination Report for EP13707425.8 (mailed Jan. 24, 2017).

* cited by examiner

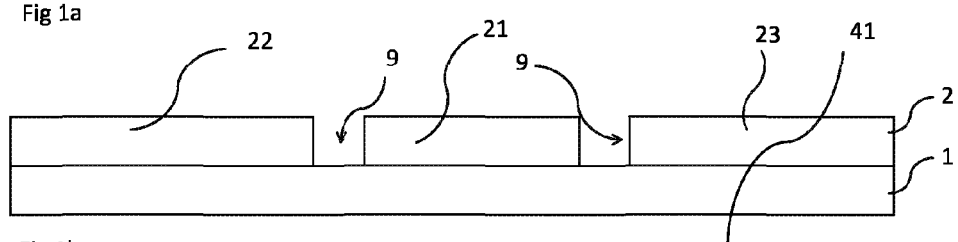
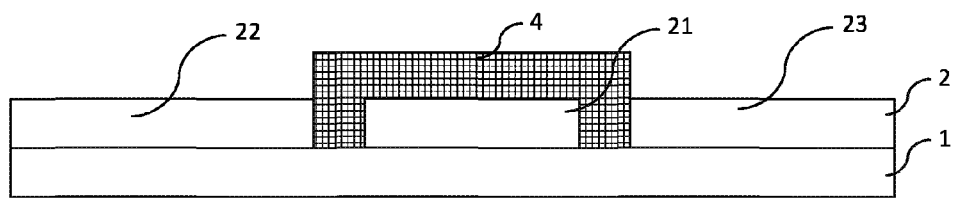
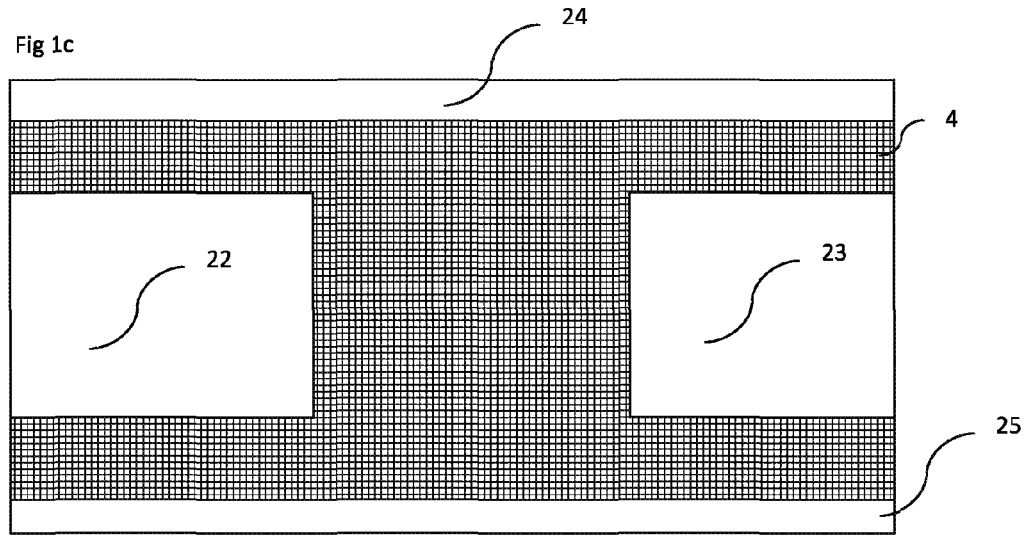
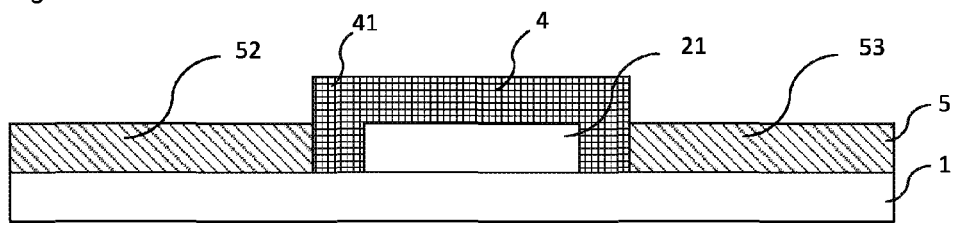

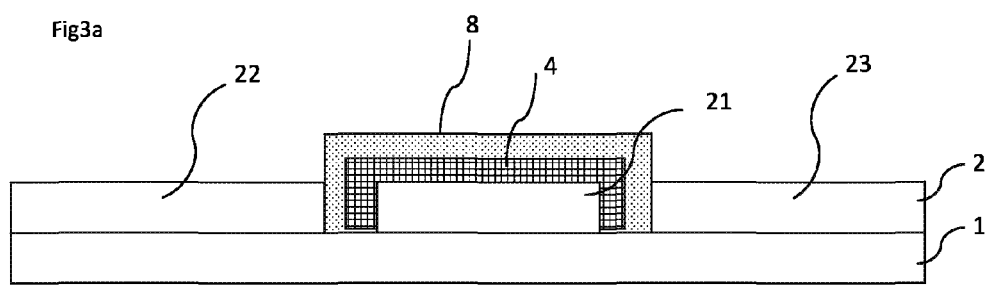
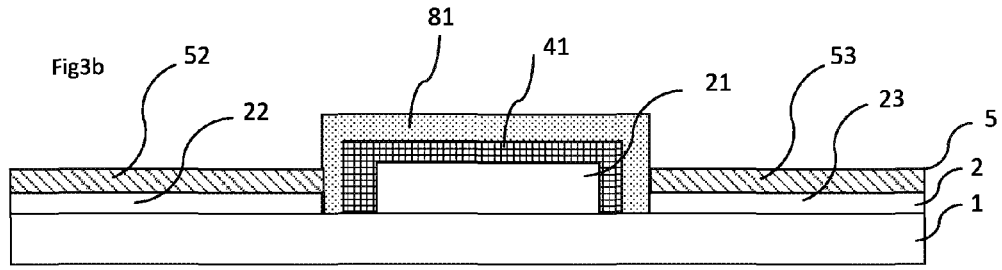

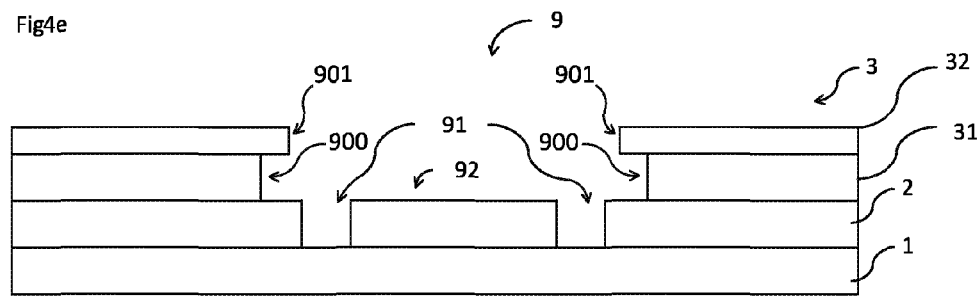
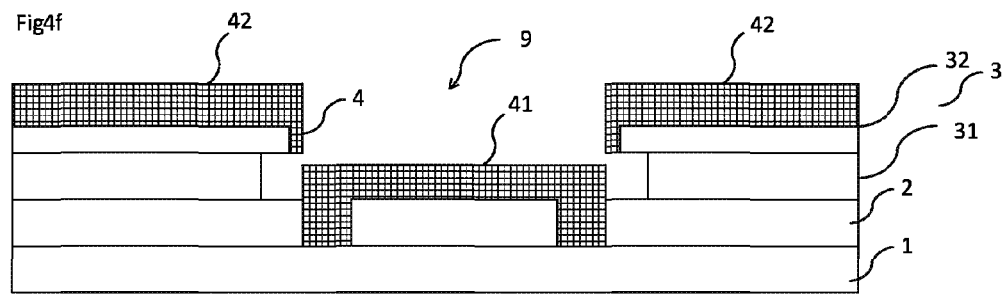
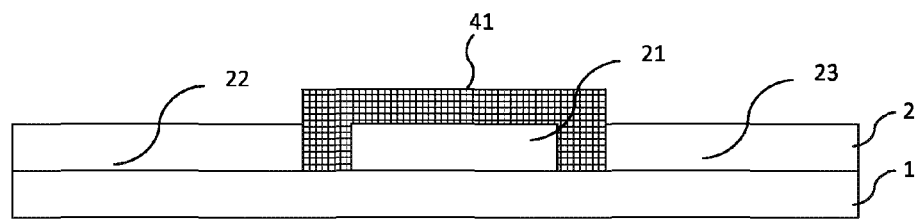
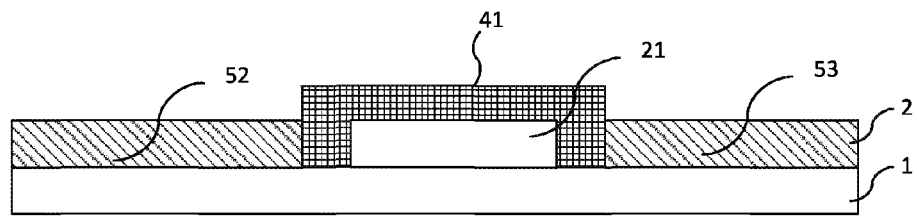

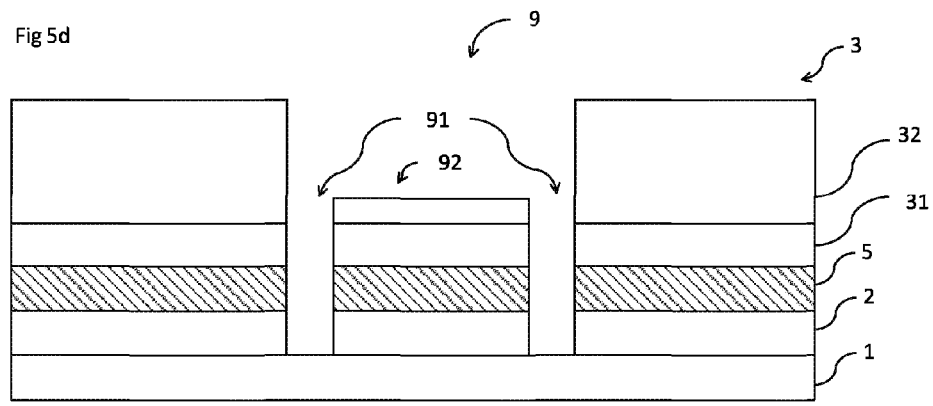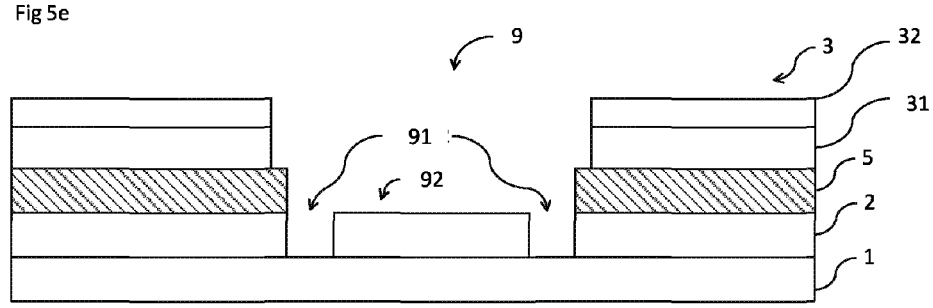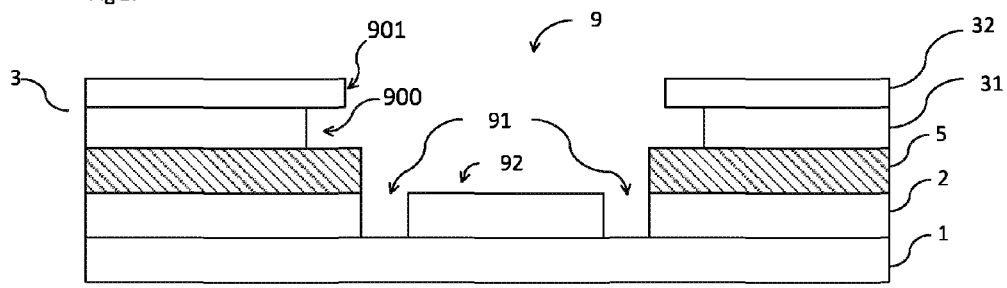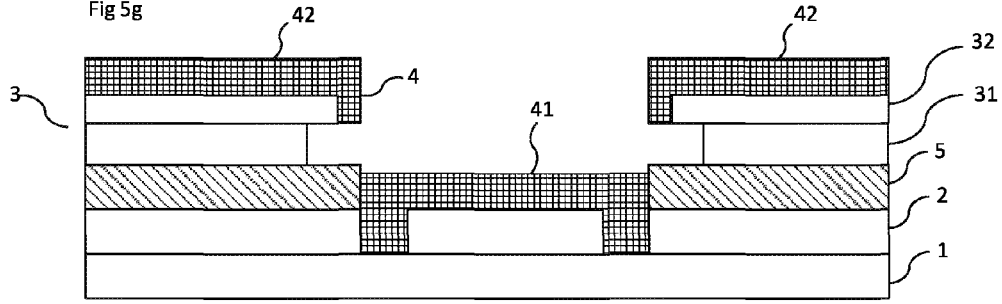

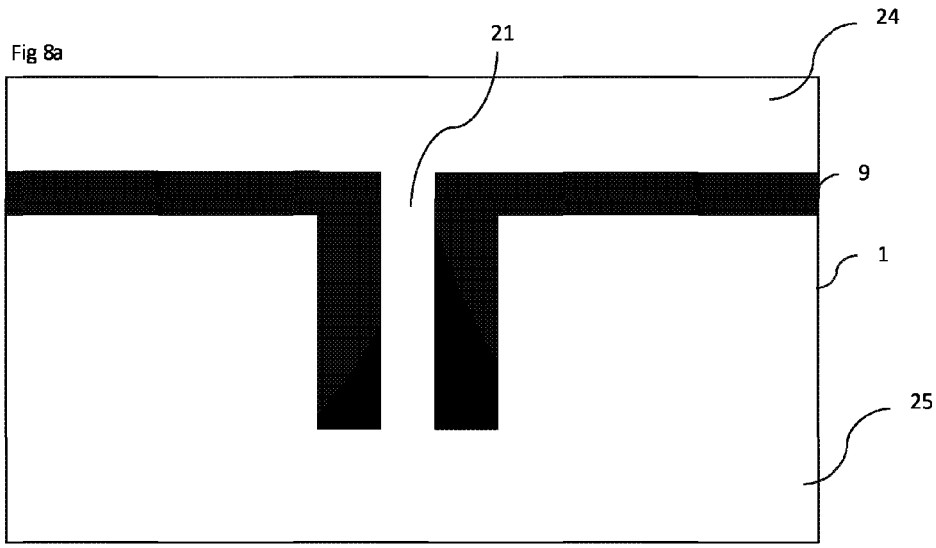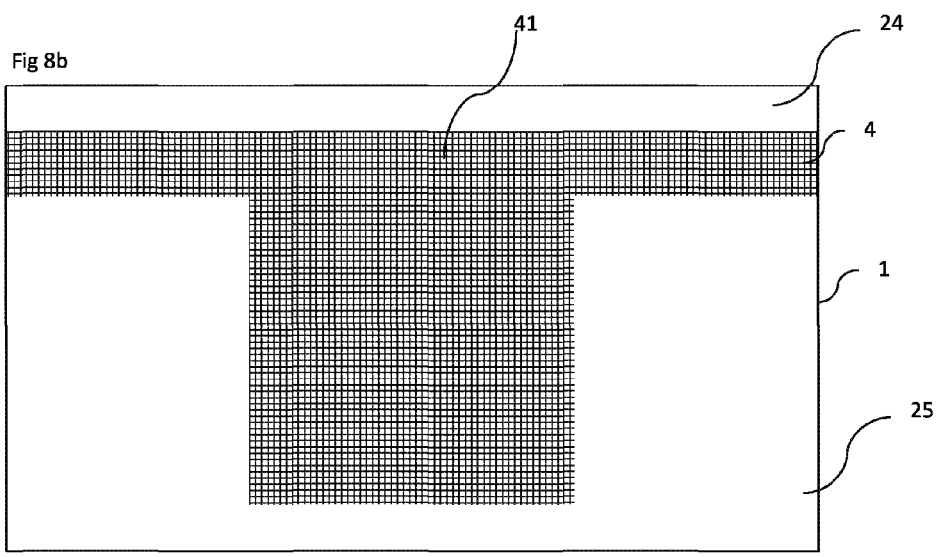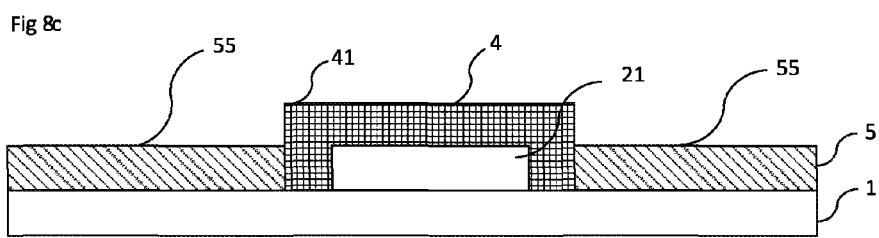

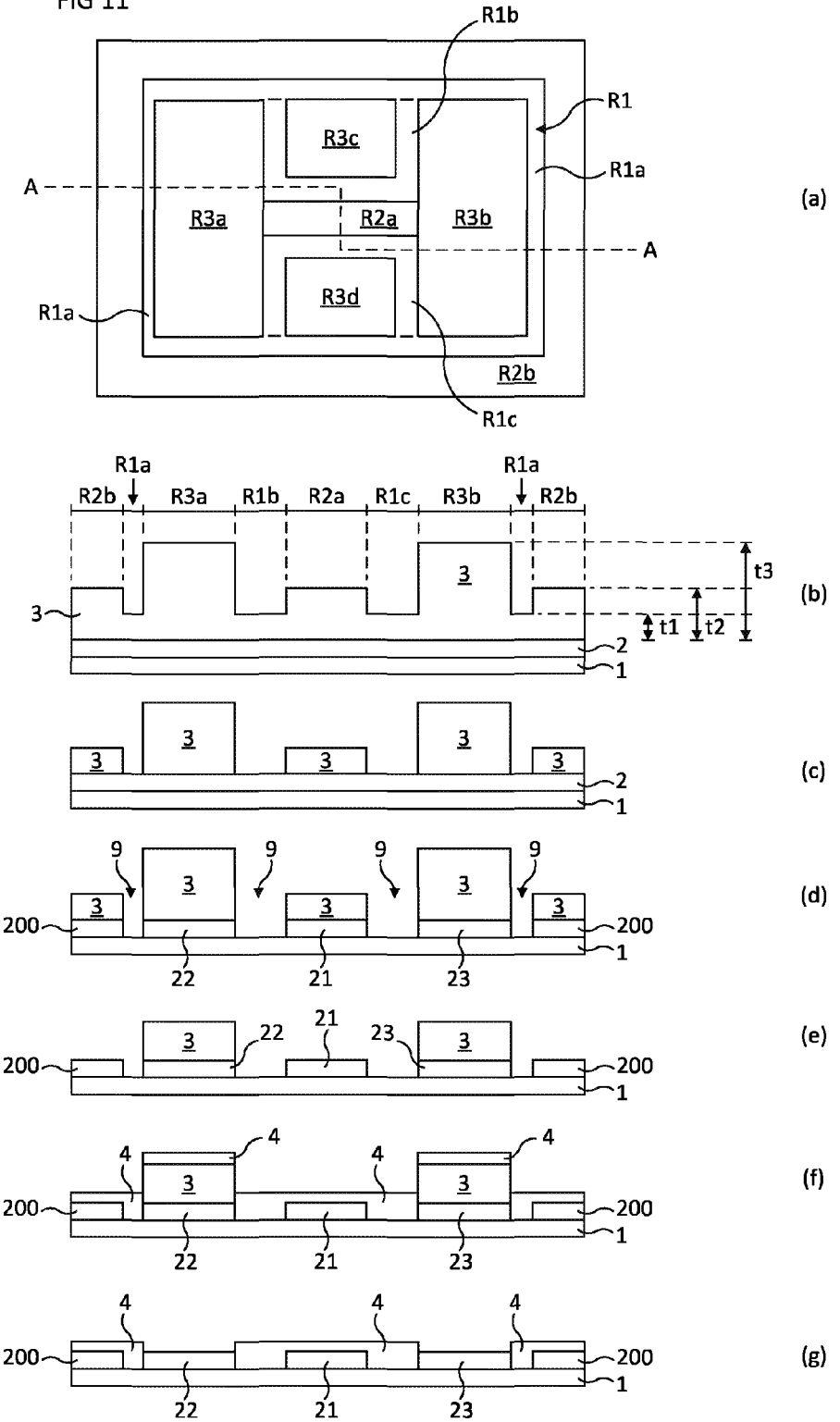

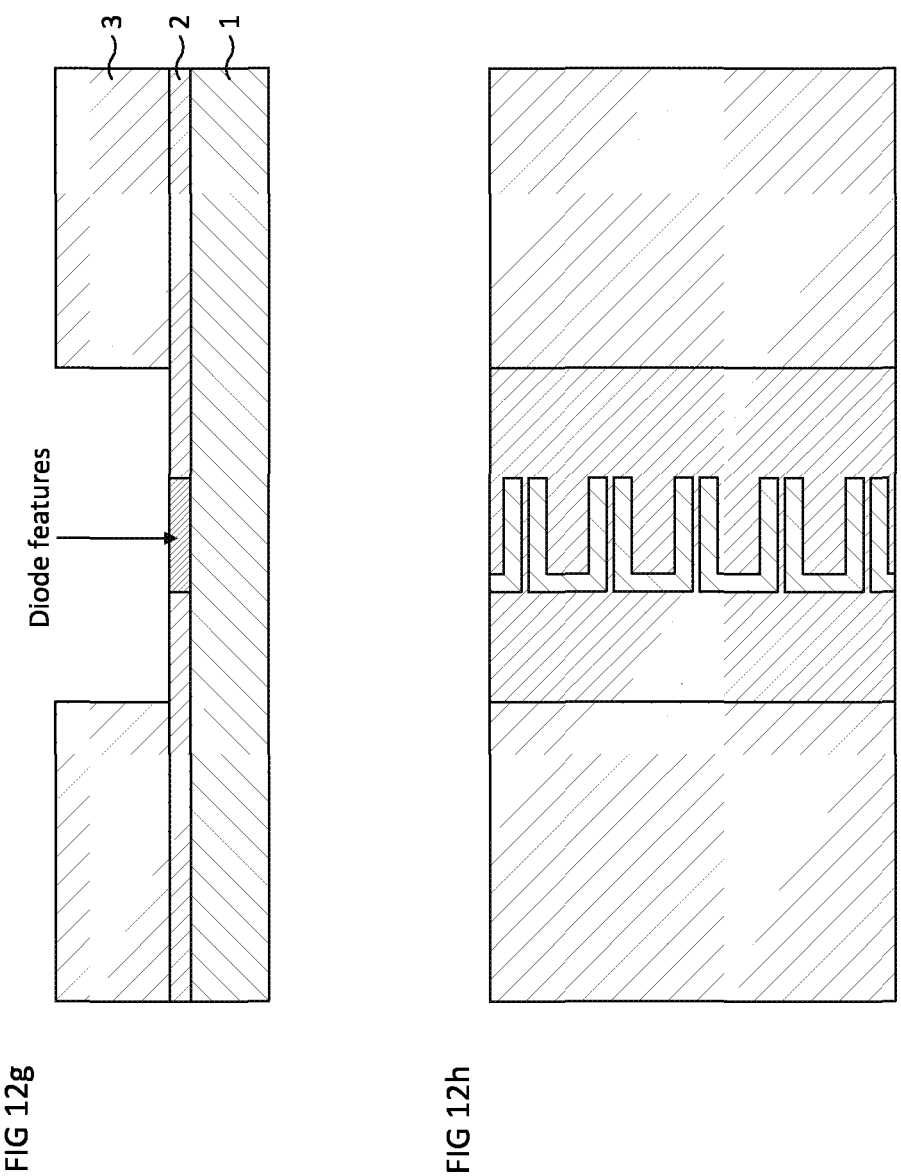

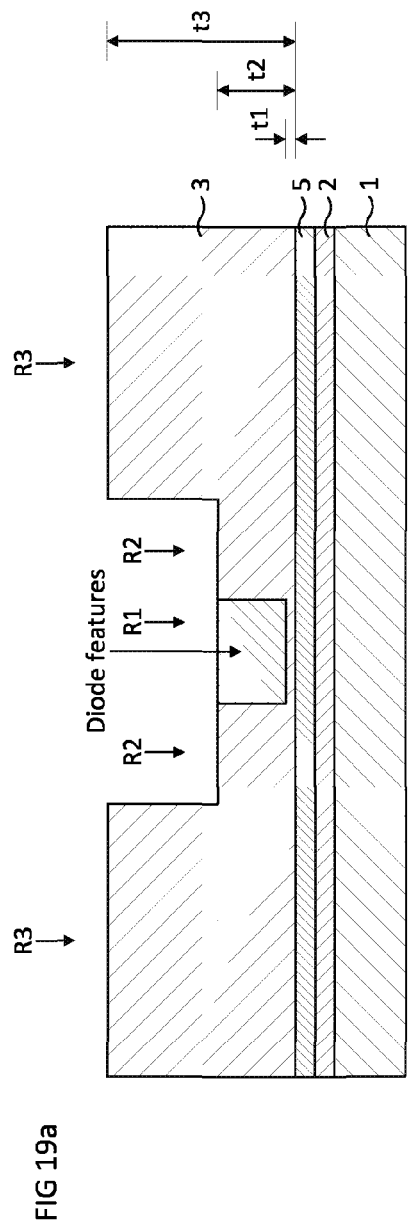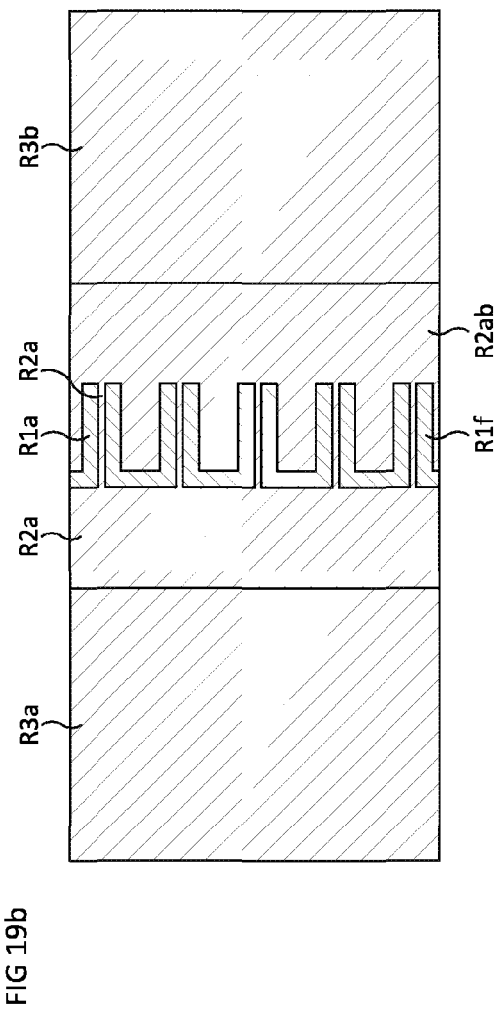
FIG 19a
FIG 19b

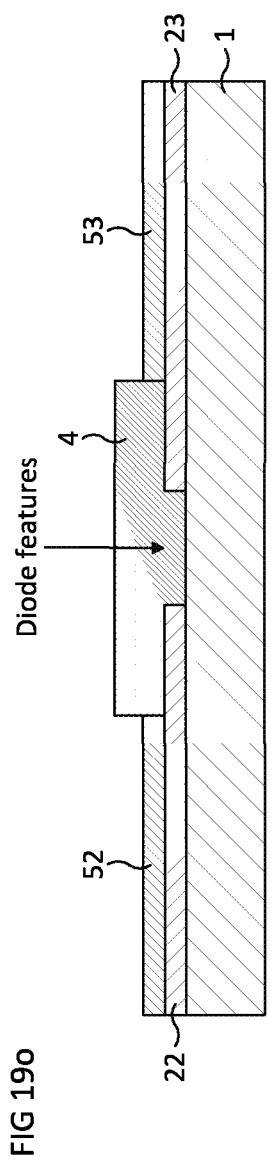

SUBSTANTIALLY PLANAR ELECTRONIC DEVICES AND CIRCUITS

CROSS REFERENCE TO RELATED APPLICATIONS

This is the U.S. National Stage of International Application No. PCT/GB2013/050416, filed Feb. 21, 2013, which in turn claims the benefit of U.K. Patent Application No. GB1202971.6, filed Feb. 21, 2012.

FIELD OF THE INVENTION

The present invention generally relates to substantially planar electronic devices, electronic circuits comprising such devices, and methods for manufacturing such devices and circuits. In particular, although not exclusively, the present invention relates to planar nano-electronic devices, that is, substantially planar electronic devices having features at the nanometer scale.

BACKGROUND TO THE INVENTION

A variety of substantially planar electronic devices are known, comprising terminals and channels formed from a single layer of material, typically semiconductor material. Those known devices include diodes and other devices showing at least a degree of self-switching behaviour, logic devices and gates, and devices, such as planar transistors, with one or more side gate terminals, arranged adjacent a semiconductor channel, to which voltages may be applied to control channel conductivity and hence flow of current through the channel. Examples of such devices are disclosed in patent publications WO2006/008467, WO2006/120414, WO2002/086973, WO2010/049728, WO2010/013064, WO2010/086651, WO2011/027159, WO2010/013067, and WO2011/064575, the contents of which are incorporated herein by reference.

A problem with substantially planar electronic devices is how to manufacture them, with their various components or features correctly aligned with respect to each other, using as few process steps as possible. Particular problems occur when a mask or patterned tool is used at one stage of the manufacturing process, and then a second mask or tool needs to be aligned, at a later stage in the manufacturing process, with features produced using the first mask or tool. In other words, correct alignment of a plurality of masks or patterned tools to produce the requisite number of device or circuit features is a problem.

Further problems include how to manufacture small planar electronic devices, how to achieve small device features, especially on the nanometer scale, and how to produce substantially planar electronic devices and circuits incorporating them using as few process steps as possible and/or by grouping process steps so that the devices and circuits can be manufactured in a more efficient manner.

A further problem with certain known planar electronic devices is that their terminals (such as their source, drain, and gate terminals in the case of planar transistors) are formed from semiconductor material and hence have relatively low electrical conductivity. This can place constraints on terminal dimensions, can adversely affect the speed of the devices, and/or can reduce the efficiency of the devices.

A further problem with planar electronic devices is that certain terminals may be required to have large area, to facilitate the making of subsequent connections or interconnections to or between those terminals, and this requirement for large area can conflict with other device requirements.

A further problem is that certain techniques for the manufacture of planar electronic devices are incompatible with techniques for the rapid production of large numbers of devices, such as arrays of devices covering large areas.

SUMMARY OF THE INVENTION

It is an aim of certain embodiments of the invention to solve, mitigate, or obviate, at least partly, at least one of the problems and/or disadvantages associated with the prior art. Certain embodiments aim to provide at least one of the advantages described below.

Certain embodiments aim to provide methods of manufacturing substantially planar electronic devices which comprise fewer steps than prior art techniques.

Certain embodiments aim to provide methods of manufacturing substantially planar electronic devices in which a single patterning step is used to define the position of all subsequent device features.

Certain embodiments aim to provide methods of manufacturing substantially planar electronic devices compatible with printing techniques and/or other techniques suitable for production of large-area arrays of devices or large-area circuits.

Certain embodiments aim to provide methods of manufacturing substantially planar electronic devices having terminals of relatively high conductivity as compared with the semiconductor channels of the devices.

Certain embodiments aim to provide methods of manufacturing substantially planar electronic devices having relatively large terminal regions, to facilitate subsequent connection to the terminals or interconnections between those terminals.

According to a first aspect of the present invention there is provided a method of manufacturing a substantially planar electronic device comprising (i.e. having at least) a first terminal, a second terminal, and a semiconductor channel providing a current flow path via which current can flow from the first terminal to the second terminal, the method comprising the steps of: providing a substrate and a layer of semiconductor material supported by the substrate;

forming a layer of resist material over the layer of semiconductor material, the layer of resist material comprising a plurality of first portions each having a first thickness, a second portion having a second thickness, and a plurality of third portions each having a third thickness, wherein the third thickness is greater than the second thickness and the second thickness is greater than the first thickness, said first portions defining positions (i.e. locations) of insulative features to be formed to interrupt the layer of semiconductor material and define at least a position of the semiconductor channel, the second portion covering at least the semiconductor channel, and said third portions defining positions of the first and second terminals;

processing (e.g. etching) the layer of resist material to remove said first portions of the layer of resist material, without removing entirely the second or third portions, to expose surfaces of corresponding underlying first portions of the semiconductor layer; removing said first portions of the semiconductor layer to expose surfaces of corresponding underlying first portions of the substrate and so form a plurality of insulative features interrupting the semiconductor layer, said plurality of insulative features defining the position of the semiconductor channel;

further processing (e.g. etching) the layer of resist material to remove said second portion of the layer of resist material, without removing entirely the third portions, to expose at least a surface of a second portion of the semiconductor layer, said second portion of the semiconductor layer providing said channel;

depositing dielectric material on the resultant structure (i.e. the structure resulting from the above method steps) such that dielectric material fills the insulative features and forms a dielectric layer covering at least the semiconductor channel; and removing (e.g. by further etching) the remaining material of the third portions of the layer of resist material to expose surfaces of corresponding underlying third portions of the semiconductor layer.

This method provides the advantage that the positions of the terminals, the semiconductor channel, and the dielectric material covering the semiconductor channel are all defined by the patterning of the initial layer of resist material. Thus, the layer of resist material can be patterned using an appropriate mask or imprint tool, having multi-height imprint features. This facilitates the manufacturing technique, and yields a structure in which the semiconductor channel is protected by a layer of dielectric material, yet the third portions of the semiconductor layer are left exposed for subsequent processing and/or for connections to be made to them.

In certain embodiments the method further comprises at least one of the following steps:

processing the third portions of the semiconductor layer to increase a conductivity of at least a part of each third portion of the semiconductor layer (whereby the processed third portions may provide the first and second terminals); and forming respective layers of conductive material over each of the third portions of the semiconductor layer (whereby the respective layers of conductive material may provide the first and second terminals).

In certain embodiments said processing to increase conductivity comprises annealing.

In certain embodiments said annealing comprises exposing at least the third portions of the semiconductor layer to electromagnetic radiation.

In certain embodiments said electromagnetic radiation is emitted from a laser.

In certain embodiments the method further comprises forming a reflective layer over the dielectric layer covering at least the semiconductor channel, the reflective layer being arranged to reflect at least a portion of said electromagnetic radiation.

In certain embodiments said reflective layer is formed after said removing of the remaining material of the third portions of the layer of resist material.

In certain embodiments said reflective layer is formed before said step of removing of the remaining material of the third portions of the layer of resist material.

In certain embodiments the dielectric material is substantially opaque to the electromagnetic radiation used to anneal the previously semiconducting material to increase its conductivity.

In certain embodiments said step of forming respective layers of conductive material comprises depositing conductive ink on the exposed surfaces of the third portions of the semiconductor layer.

In certain embodiments the method further comprises forming a hydrophobic layer over the dielectric layer covering at least the semiconductor channel before depositing said conductive ink, the hydrophobic layer being arranged to repel said conductive ink.

In certain embodiments said hydrophobic layer is formed after said removing of the remaining material of the third portions of the layer of resist material.

In certain embodiments said hydrophobic layer is formed by transferring hydrophobic material from a carrier to a surface of the dielectric layer covering at least the semiconductor channel.

In certain embodiments said hydrophobic layer is formed before said step of removing of the remaining material of the third portions of the layer of resist material.

In certain embodiments said step of forming respective layers of conductive material comprises electroforming or electroplating.

In certain embodiments said step of forming respective layers of conductive material comprises chemical vapour deposition.

In certain embodiments forming said layer of resist material comprises forming a first sub-layer of a first resist material over the layer of semiconductor material, and forming a second sub-layer of a second resist material over the first sub-layer.

In certain embodiments the first resist material is a lift-off resist material.

In certain embodiments the second resist material is a UV-curable polymer

In certain embodiments the method further comprises forming, after said further processing but before said depositing of dielectric material, at least one undercut in the first sub-layer.

In certain embodiments forming said layer of resist material comprises using an imprint tool having imprint features having a plurality of different heights.

According to another aspect of the present invention, there is provided a method of manufacturing a substantially planar electronic device comprising (i.e. having at least) a first terminal, a second terminal, and a semiconductor channel providing a current flow path via which current can flow from the first terminal to the second terminal, the method comprising the steps of:

providing a substrate, a layer of semiconductor material supported by the substrate, and a layer of conductor material covering the layer of semiconductor material;

forming a layer of resist material over the layer of conductor material, the layer of resist material comprising a plurality of first portions each having a first thickness, a second portion having a second thickness, and a plurality of third portions each having a third thickness, wherein the third thickness is greater than the second thickness and the second thickness is greater than the first thickness, said first portions defining positions (i.e. locations) of insulative features to be formed to interrupt the layer of semiconductor material and define at least a position of the semiconductor channel, the second portion covering at least the semiconductor channel, and said third portions defining positions of the first and second terminals;

processing (e.g. etching) the layer of resist material to remove said first portions of the layer of resist material, without removing entirely the second or third portions, to expose surfaces of corresponding underlying first portions of the conductor layer;

removing said first portions of the conductor layer to expose surfaces of corresponding underlying first portions of the semiconductor layer;

removing said first portions of the semiconductor layer to expose surfaces of corresponding underlying first portions of the substrate and so form a plurality of insulative features interrupting the semiconductor layer, said plurality of insulative features defining the position of the semiconductor channel;

further processing (e.g. etching) the layer of resist material to remove said second portion of the layer of resist material, without removing entirely the third portions, to expose at least a surface of a second portion of the conductor layer;

removing said second portion of the conductor layer to expose at least a surface of a second portion of the semiconductor layer, said second portion of the semiconductor layer providing said channel;

depositing dielectric material on the resultant structure (i.e. the structure resulting from the above method steps) such that dielectric material fills the insulative features and forms a dielectric layer covering at least the semiconductor channel; and removing (e.g. by further etching) the remaining material of the third portions of the layer of resist material to expose surfaces of corresponding underlying third portions of the conductor layer.

Advantageously, the positions of the device terminals and semiconductor channel are all defined by the initial patterning of the resist material, which can be achieved using a single imprint tool, for example.

In certain embodiments the method further comprises processing third portions of the layer of semiconductor material underlying said third portions of the conductor layer to increase a conductivity of at least a part of each third portion of the semiconductor layer.

In certain embodiments forming said layer of resist material comprises forming a first sub-layer of a first resist material over the layer of conductor material, and forming a second sub-layer of a second resist material over the first sub-layer.

In certain embodiments the first resist material is a lift-off resist material.

In certain embodiments the second resist material is a UV-curable polymer

In certain embodiments the method further comprises forming, after said further processing but before said depositing of dielectric material, at least one undercut in the first sub-layer.

In certain embodiments forming said layer of resist material comprises using an imprint tool having imprint features having a plurality of different heights.

Another aspect provides a method of manufacturing a substantially planar electronic device comprising a first terminal, a second terminal, and a semiconductor channel providing a current flow path via which current can flow from the first terminal to the second terminal, the method comprising the steps of:

providing a first structure comprising a substrate, a layer of semiconductor material supported by the substrate, and a layer of conductor material covering the layer of semiconductor material;

processing the first structure to form a second structure comprising said substrate, a first terminal region comprising a first portion of the layer of semiconductor material covered by a first portion of the layer of conductor material, a second terminal region comprising a second portion of the layer of semiconductor material covered by a second portion of the layer of conductor material, a third portion of the layer of semiconductor material optionally covered by a third portion of the layer of conductor material and providing a semiconductor channel connecting the first and second terminal regions, and a plurality of insulative features interrupting the layer of semiconductor material and defining at least a position of the semiconductor channel;

forming a layer of photoresist material over the second structure to cover the first and second terminal regions, the third portion of the layer of semiconductor material, and the insulative features to form a third structure;

exposing the third structure to electromagnetic radiation from a direction such that the first and second portions of the layer of conductor shield overlying portions of the layer of photoresist material from the radiation;

removing an exposed portion of the layer of photoresist material to form a window through said layer of photoresist material;

depositing dielectric material at least within said window to form a layer of dielectric material filling the insulative features and covering, either directly or indirectly, the third portion of the layer of semiconductor material; and removing remaining material of the layer of photoresist material to expose the first and second portions of the layer of conductor material.

Another aspect of the invention provides an electronic device manufactured using a method in accordance with any aspect or embodiment described above.

In certain embodiments the device comprises a semiconductor channel, a dielectric layer covering the channel, and a layer of hydrophobic material covering the dielectric layer.

Another aspect provides an electronic circuit comprising at least one electronic device in accordance with the above-described aspect.

BRIEF DESCRIPTION OF THE DRAWINGS

Embodiments of the present invention will now be described with reference to the accompanying drawings, of which:

FIG. 3 shows another planar device which has been manufactured using a method embodying the invention;

FIG. 11 illustrates steps in a method embodying the invention for manufacturing a substantially planar electronic device in the form of a planar transistor having source and drain terminals connected by a semiconductor channel, and side gate terminals on either side of the channel;

FIGS. 12a-12l illustrate steps in another method of manufacturing a planar electronic device embodying the invention;

DETAILED DESCRIPTION OF EMBODIMENTS OF THE INVENTION

Figure 1E:
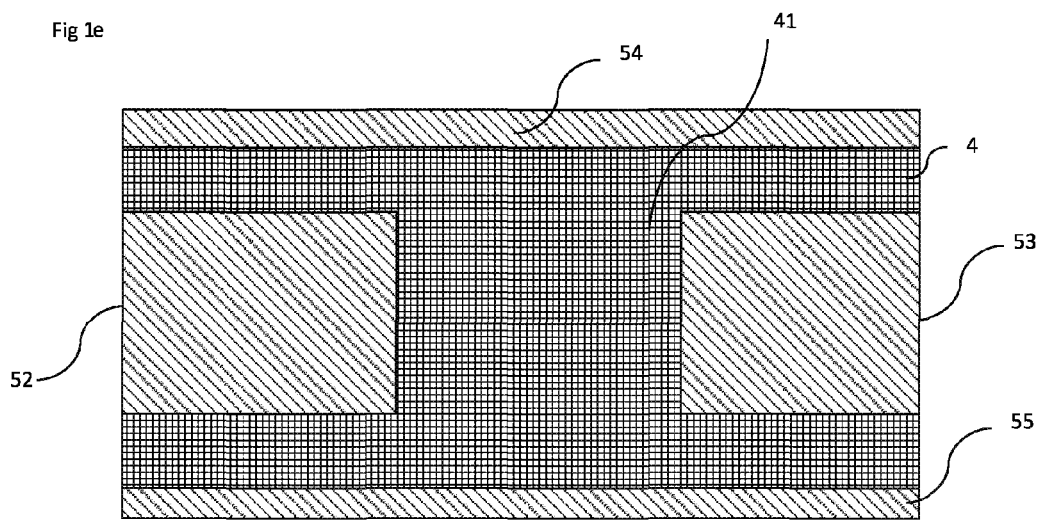
FIG. 1 illustrates steps in the manufacture of a planar device using a method embodying the invention.

Referring now to FIG. 1, this shows steps in a process to produce a substantially planar device in a method embodying the invention. FIG. 1a shows a layer 2 of semiconductor material, supported on a substrate 1, which has been patterned into areas 21, 22, 23, 24 and 25 (regions 24 and 25 are not shown in FIG. 1a) to leave windows 9 separating the respective regions of semiconductor material. FIG. 1b shows a further step where a layer 4 of dielectric material has been deposited so as to completely cover region 21 and windows 9. FIG. 1c shows a top-view of the configuration in FIG. 1b, indicating the regions of semiconductive material 24 and 25. FIG. 1d shows a further stage after further processing which has changed the properties of the uncovered semiconductive regions 22, 23, 24 and 25 such that their conductivity has been substantially increased. These regions 52, 53, 54 and 55 form part of layer 5 which is now conductive rather than semiconductive. Enclosed layer 21 is substantially unchanged after the processing. The device now has the features of a planar transistor with contact regions 54 and 55, channel area 21, dielectric area 41 and gate areas 52 and 53.

Figure 2A:
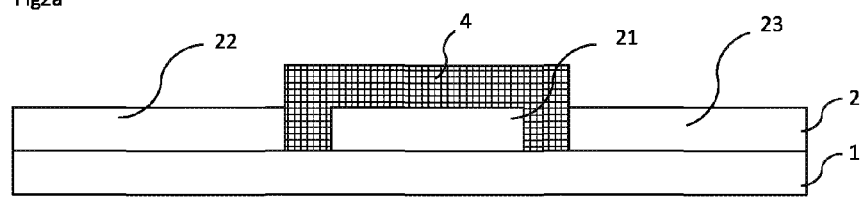
FIG. 2 illustrates a planar device manufactured by a method embodying the invention.
Figure 2B:
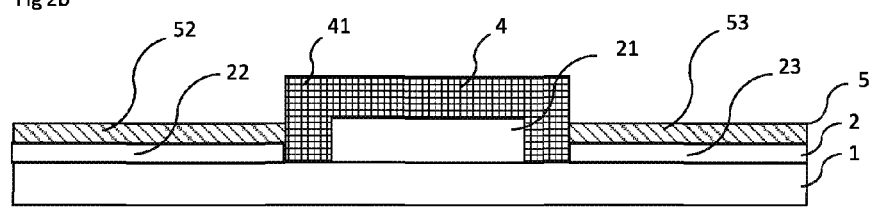
Figure 2C:
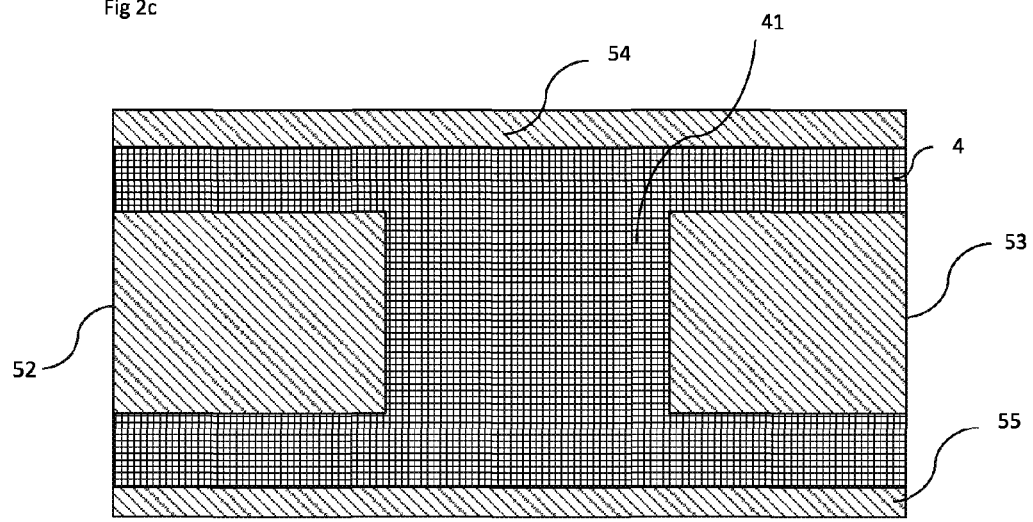
Figure 4A:
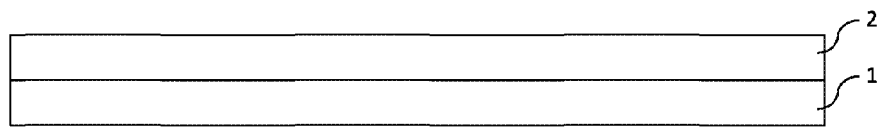
FIG. 4 illustrates steps in a process to make a device embodying the invention.
Figure 4B:
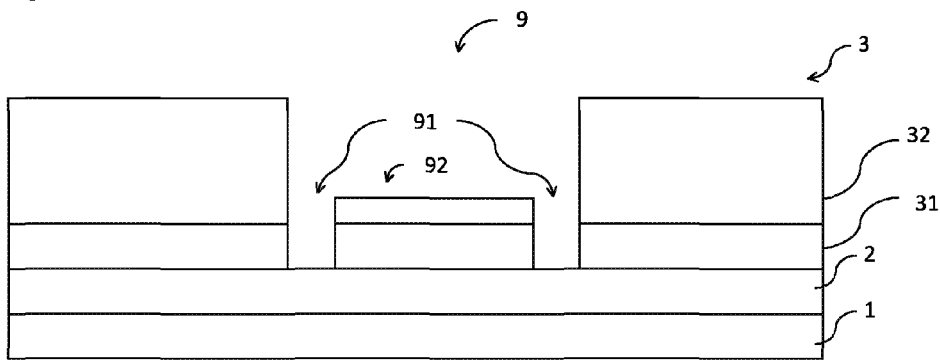
Figure 4C:
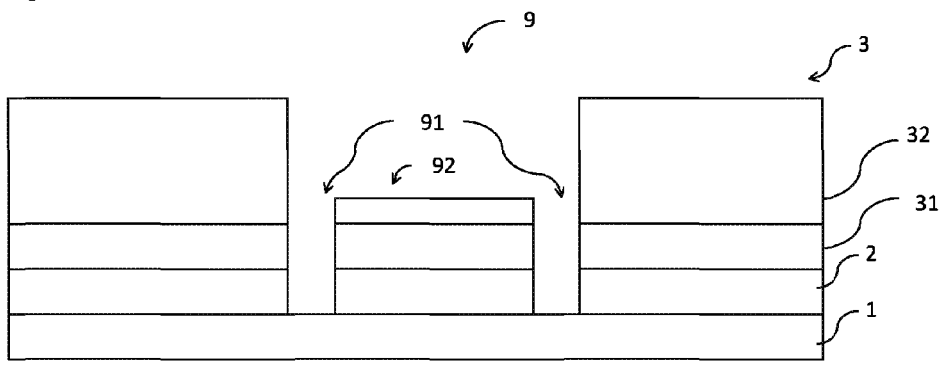
Figure 4D:
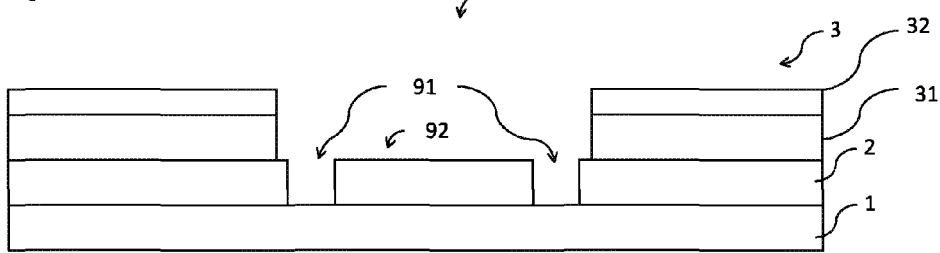
Figure 5A:
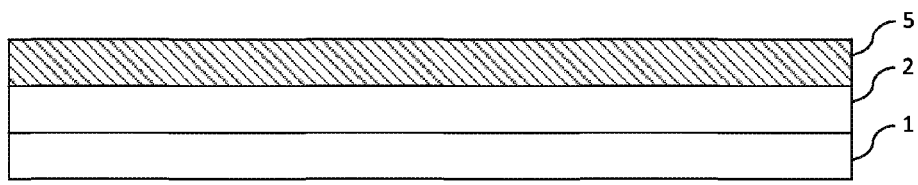
FIG. 5 illustrates steps in another process to make a device embodying the invention.
Figure 5B:
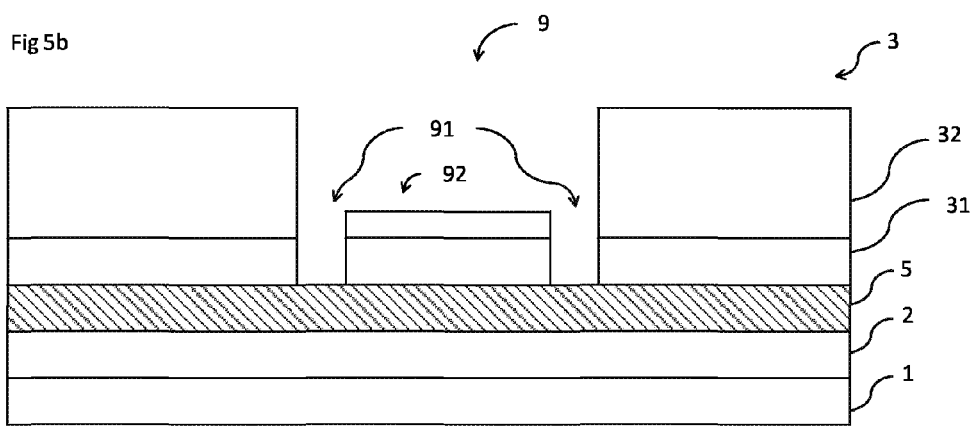
Figure 5C:
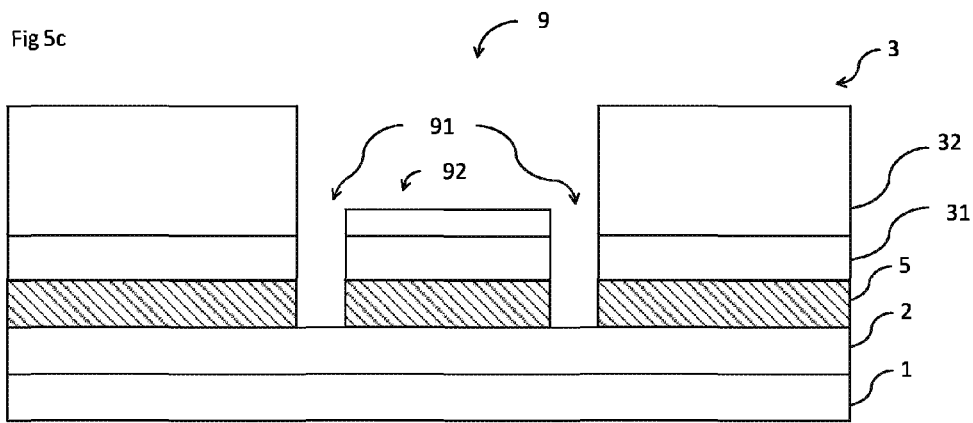
Figure 5H:
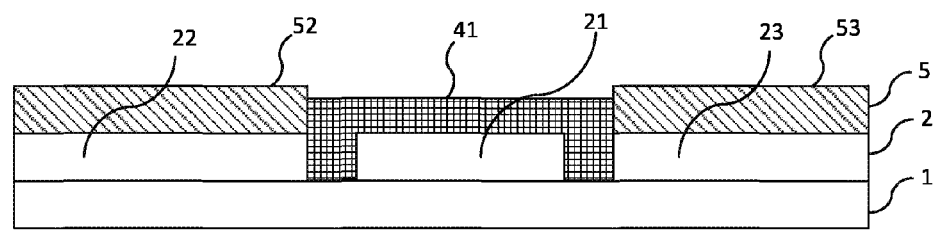
Figure 5I:
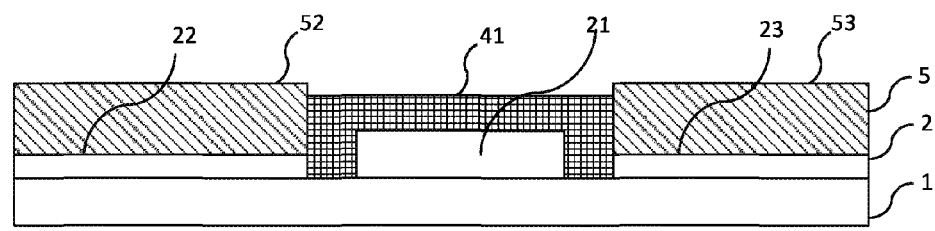

Referring now to FIG. 2, this shows steps in a process to produce a substantially planar device in a method embodying the invention. FIG. 2a shows the same structure as in FIG. 1b, with a layer 2 of semiconductor material, supported on a substrate 1, which has been patterned into areas 21, 22, 23, 24 and 25 (regions 24 and 25 are not shown in FIG. 1a) and a layer 4 of dielectric material which has been deposited so as to completely cover region 21. FIG. 2b shows a subsequent stage after further processing which has changed the properties of part of the uncovered semiconductive regions 22, 23, 24 and 25 such that the conductivity in an upper-portion of these regions has been substantially increased. These regions 52, 53, 54 and 55 form part of layer 5 which is now conductive rather than semiconductive. Enclosed layer 21 is substantially unchanged after the processing, as are the lower-regions 22, 23, 24 and 25. The device now has the features of a planar transistor (FIG. 2c) with contact regions 54 and 55, channel area 21, dielectric area 41 and gate areas 52 and 53.

Referring now to FIG. 3 this shows steps in a process to produce a substantially planar device in a method embodying the invention. FIG. 3a shows a side-view of a layer 2 of semiconductive material which has been patterned into regions 21, 22, 23, 24 and 25 (24 and 25 not shown). Two layers of dielectric material 4 and 8 has been deposited and patterned such that they completely cover region 21. In this instance the dielectric layer 8 is highly reflective to a certain wavelength laser exposure whereas layer 4 is highly transparent to r a certain wavelength laser exposure. FIG. 3b shows a further stage where the structure has been exposed to a certain wavelength laser irradiation. Layer 8 reflects the laser radiation so as to leave region 21 unaffected. The uncovered semiconductive regions 22, 23, 24 and 25 absorb the radiation and the conductivity in the upper portion of these regions is substantially increased. The device now has the features of a planar transistor (as shown in FIG. 2c) with contact regions 54 and 55, channel area 21, dielectric area 41 and gate areas 52 and 53.

Referring now to FIG. 4 this illustrates steps in forming a planar device embodying the invention. FIG. 4a shows a layer of semiconductor material 2 supported by a substrate 1. In FIG. 4b a stack 3 of resist material has been deposited. Resist layer 3 consists of two materials, a UV curable polymer 32 and a lift-off material 31. The resist layer has been patterned using an imprint tool shown in FIG. 6 to create a window 9. The imprint tool 400 has been urged into the resist stack 3, exposed to UV light and then withdrawn. Window 9 consists of lower regions 91 (corresponding to features 401 on imprint tool 400 in FIG. 6) and upper region 92 (corresponding to feature 402 on imprint tool 400 in FIG. 6). Resist stack 3 has been reduced in height such that lower region 91 of window 9 completely exposes the top surface of semiconductive layer 2. FIG. 4c shows a further stage where the exposed semiconductive material in lower regions 91 have been completely removed. FIG. 4d shows a subsequent stage in the process where the resist stack 3 has been etched, both reducing its overall height and width such that resist in region 92 has been completely removed. FIG. 4e shows a further step where the lift-off material 31 has been further etched by solvent developer to create undercuts 900 or lips 901 in the resist stack 3. In FIG. 4f a layer 4 of dielectric material has been deposited over the entire substrate. In region 92 this has covered the semiconductive layer 2 to create a dielectric region 41, whereas in other regions this has covered resist stack 3 to create dielectric regions 42. In FIG. 4g the lift-off resist 31 has been completely removed by solvent developer in the same process removing UV curable polymer 32 and dielectric regions 42. The resulting structure consists of semiconductive channel region 21, covered by dielectric layer 41, gate regions 22 and 23, and contact regions 24 and 25 (not shown). A top-view of the same configuration is shown in FIG. 1e. In FIG. 4h the conductivity of regions 22, 23, 24 and 25 have been substantially enhanced. Channel region 21 has been unaffected by the change. The device now has the features of a planar transistor (FIG. 4h) with contact regions 54 and 55, channel area 21, dielectric area 41 and gate areas 52 and 53.

Referring now to FIG. 5 this illustrates steps in a process to make a device embodying the invention. FIG. 5a shows a layer 5 of conductive material on top of a layer 2 of semiconductive material supported by a substrate 1. In FIG. 5b a stack 3 of resist material has been deposited. Resist layer 3 consists of two materials, a UV curable polymer 32 and a lift-off material 31. The resist layer has been patterned using an imprint tool shown in FIG. 6 to create a window 9. The imprint tool 400 has been urged into the resist stack 3, exposed to UV light and then withdrawn. Window 9 consists of lower regions 91 (corresponding to features 401 on imprint tool 400 in FIG. 6) and upper region 92 (corresponding to feature 402 on imprint tool 400 in FIG. 6). Resist stack 3 has been reduced in height such that lower region 91 of window 9 completely exposes the top surface of conductive layer 5. FIG. 5c shows a further stage where the exposed conductive material in lower region 92 has been completely removed so as to expose a region of the semi-conductive layer 2. FIG. 5d shows a further stage where the exposed semiconductive material in lower region 92 has been completely removed. FIG. 5e shows a subsequent stage in the process where the resist stack 3 has been etched reducing both its overall height and width such that resist in region 92 has been completely removed. FIG. 5f shows a further step where the lift-off material 31 has been further etched by solvent developer to create an undercut 900 (and hence lip 901) in the resist stack 3. In FIG. 5g a layer 4 of dielectric material has been deposited over the entire substrate. In region 92 this has covered the semiconductive layer 2 to create a dielectric region 41, whereas in other regions this has cover resist stack 3 to create dielectric regions 42. In FIG. 5h the lift-off resist 31 has been completely removed by solvent developer in the same process removing UV curable polymer 32 and dielectric regions 42. The resulting structure consists of semiconductive channel region 21, covered by dielectric layer 41, gate regions 22 and 23, and contact regions 24 and 25 (not shown). A top-view of the same configuration is shown in FIG. 2c. In FIG. 5i the substrate has been exposed to thermal and laser annealing. The conductive material 5 is substantially opaque to the laser such that this process has not substantially increased the conductivity of the semiconductive regions 22, 23, 24 and 25, which are covered by conductive material 5. However, the thermal annealing process has lowered the contact resistance between conductive layer 5 and semiconductive layer 2, thus improving the device performance. Dielectric material 4 is partially transmissive of the laser radiation such that the interface of channel region 21 with dielectric region 41 has been improved to remove defects. The dielectric properties of region 41 have also been enhanced to improve overall device performance. The device now has the features of a planar transistor (FIG. 5l) with contact regions 54 and 55, channel area 21, dielectric area 41 and gate areas 52 and 53.

Figure 6:
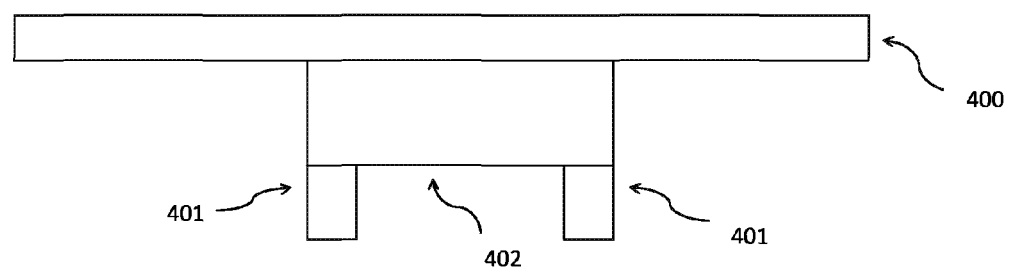
FIG. 6 shows a multi-height imprint tool, for use in methods embodying the invention.

Referring now to FIG. 6 this shows a multi-height imprint tool 400, which is transparent to UV light and has features 401 and 402 of different heights.

Figure 7A:
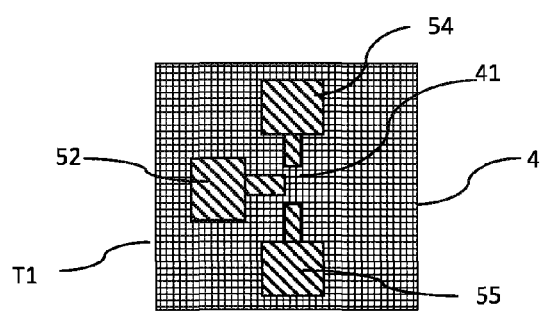
FIG. 7 illustrates the use of printed interconnections to create circuits from devices embodying the invention.
Figure 7B:
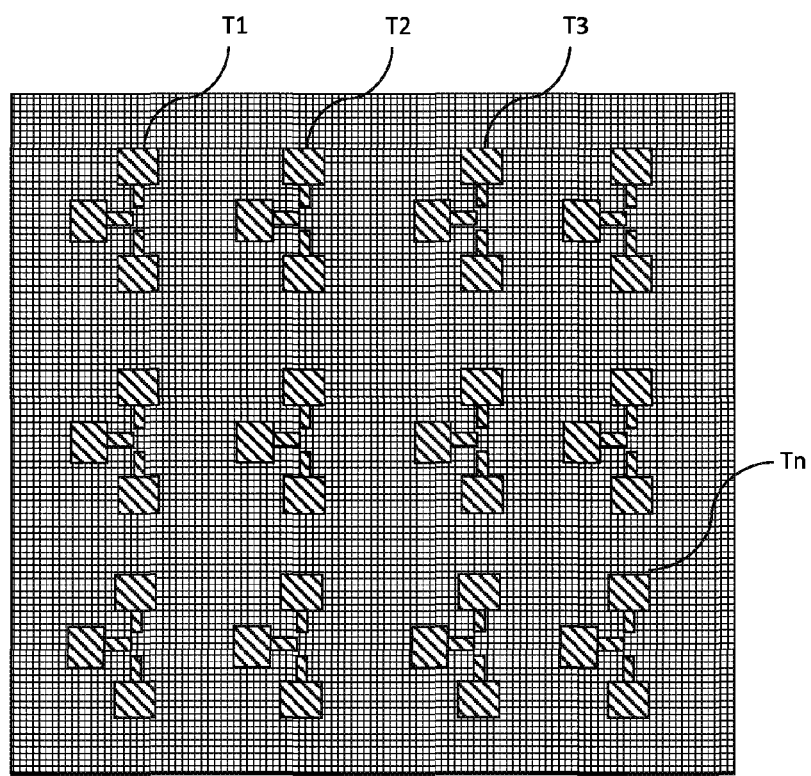
Figure 7C:
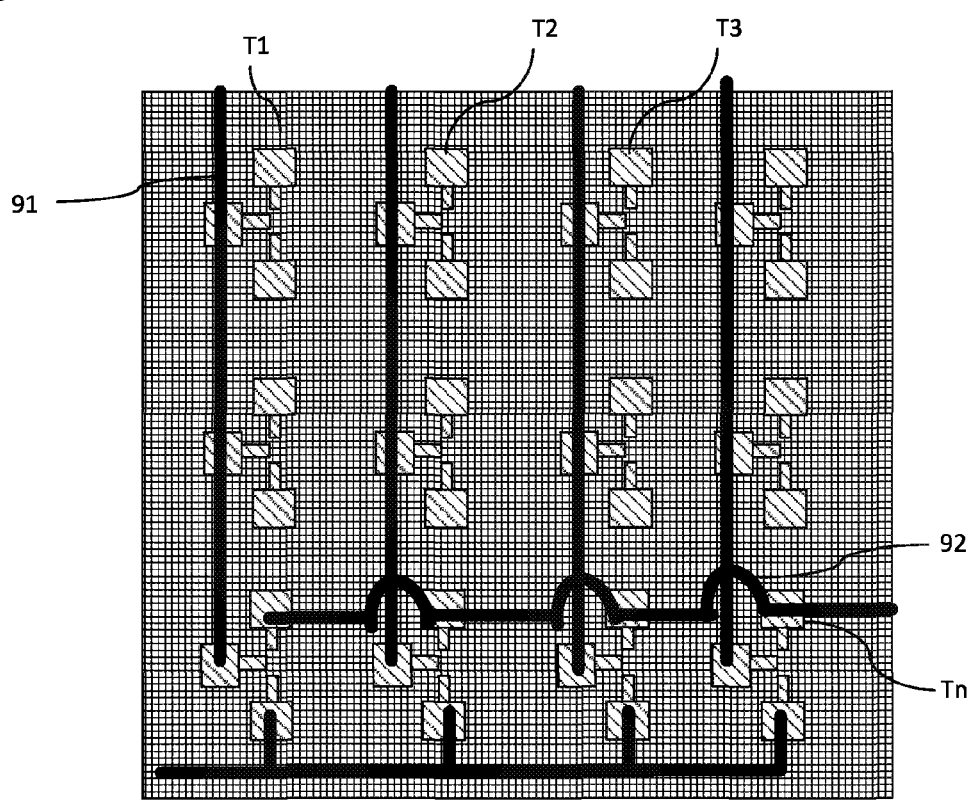

Referring now to FIG. 7 this shows a method of interconnecting devices made possible by the invention. FIG. 7a shows a single-gate planar transistor T1. T1 consists of exposed gate region 52, source region 54 and drain region 55, which have been produced by a method embodying the invention. Dielectric layer 4 covers the remainder of the top-surface with dielectric region 41 protecting the semi-conductor channel region. In FIG. 7b an array of identical transistors T1, T2, T3, . . . Tn has been fabricated. FIG. 7c shows a method of providing interconnects using additive printing. The larger contact regions 52, 54 and 55 produced by the invention allow coarser alignment methods for inter-connects to be employed, such as inkjet printing. The interconnections 91 are made by depositing conductive inks. Crossover connections 92 using bridges to crossover inter-connections 91 are also possible using printed insulating materials of sufficient thickness, which may for example be UV-cured.

Figure 8D:
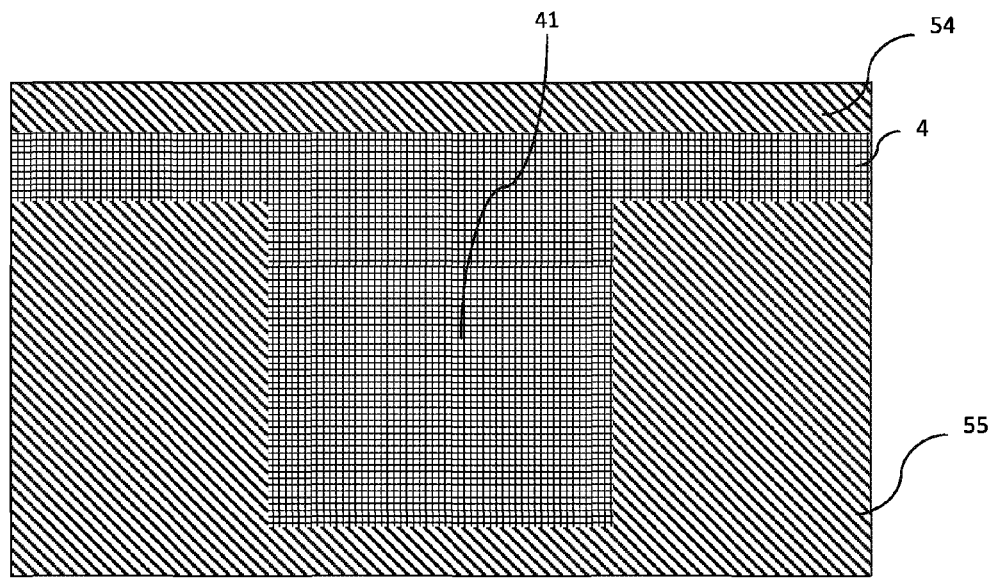
FIG. 8 illustrates a planar diode which has been fabricated by a method embodying the invention.

Referring now to FIG. 8 this shows steps in a process to create a substantially planar diode in a method embodying the invention. In FIG. 8a a layer 2 of semiconductive material, supported by a substrate 1, has been patterned into regions 21, 24 and 25, through the creation of windows 9. FIG. 8b shows a subsequent step where a layer 4 of dielectric material has been deposited over the substrate and patterned in dielectric region 41 filling-in windows 9 and covering semiconductive region 21. In FIGS. 8c and 8d the uncovered regions of semiconductive material 24 and 25 have been converted into high conductivity regions 54 and 55 through exposing to a plasma. FIG. 8c shows a side-view of the configuration in which semiconductive channel region 21 is unaffected by the plasma. FIG. 8d shows a top-view of the final configuration. Regions 54 and 55 are the source and drain regions of a planar diode with region 21 the channel region.

Referring now to FIG. 9 this illustrates steps in a roll-to-roll process to fabricate planar diodes. FIG. 9a shows a substrate 1 which has been partially covered with semicon-ductive layer 2. Semiconductive layer 2 has been patterned to create insulating windows 9 separating semiconductive regions 21, 24 and 25. In FIG. 9b the windows 9 and semiconductive regions 21 have been covered by dielectric layer 4. The areas represented by windows 9 are shown for clarity but are now completely filled with dielectric material. FIG. 9c shows a further step where the substrate has been exposed to laser irradiation so as to increase the conductivity of the exposed semiconductive regions 24 and 25. These new regions 54 and 55 are now substantially conductive rather than semiconductive. In FIG. 9d the edges of substrate 1 have been printed with conductive material to create stripes 91 and 92. In FIG. 9e the conductive stripes 91 and 92 have been connected to conductive regions 54 and 55 respectively by printing of conductive material, creating interconnections 93 and 94. FIG. 9f shows a side-view of the structure formed, with channel material 21, covered by dielectric layer 4, surrounded by source region 54 and drain region 55, in turn connected respectively to conductive stripes 91 and 92 via respective conductive interconnections 93 and 94.

Figure 9A:
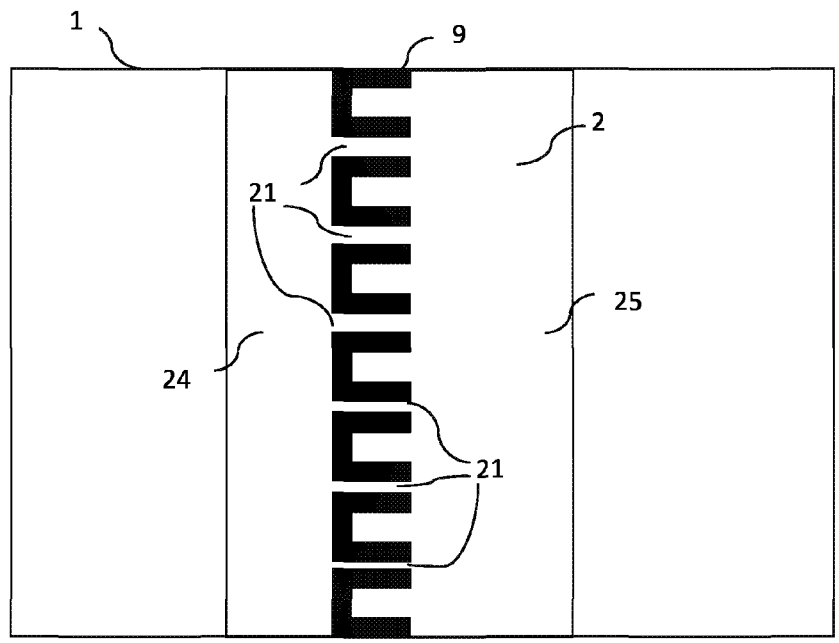
FIG. 9 illustrates steps in a roll-to-roll process to produce planar diodes fabricated in a method embodying the invention.
Figure 9B:
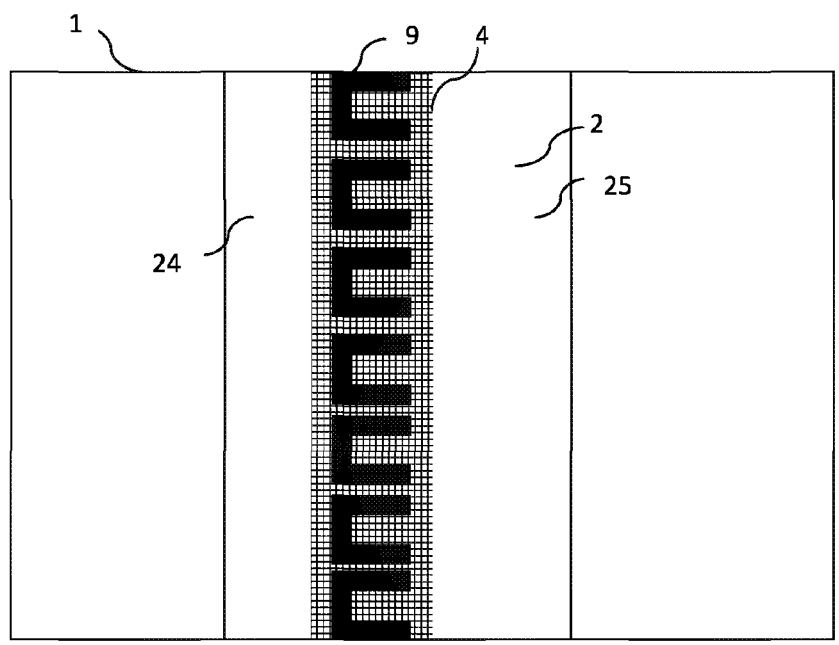
Figure 9C:
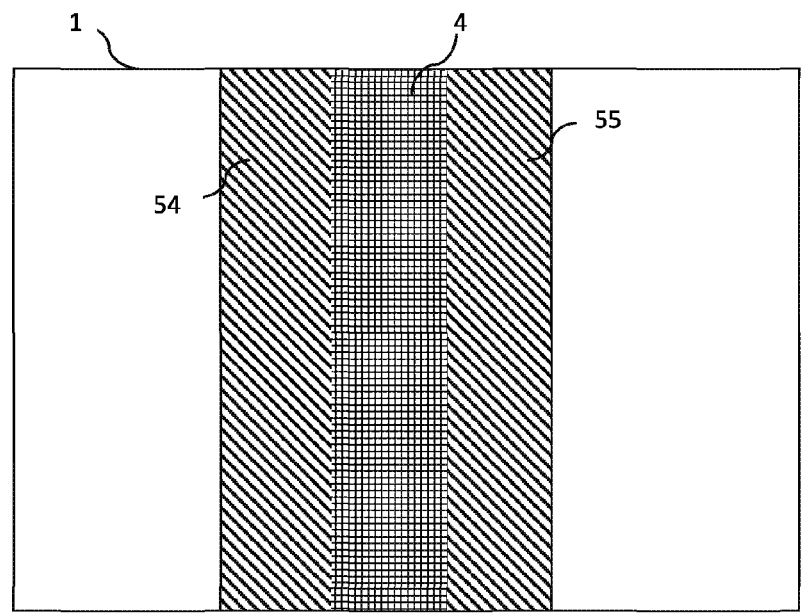
Figure 9D:
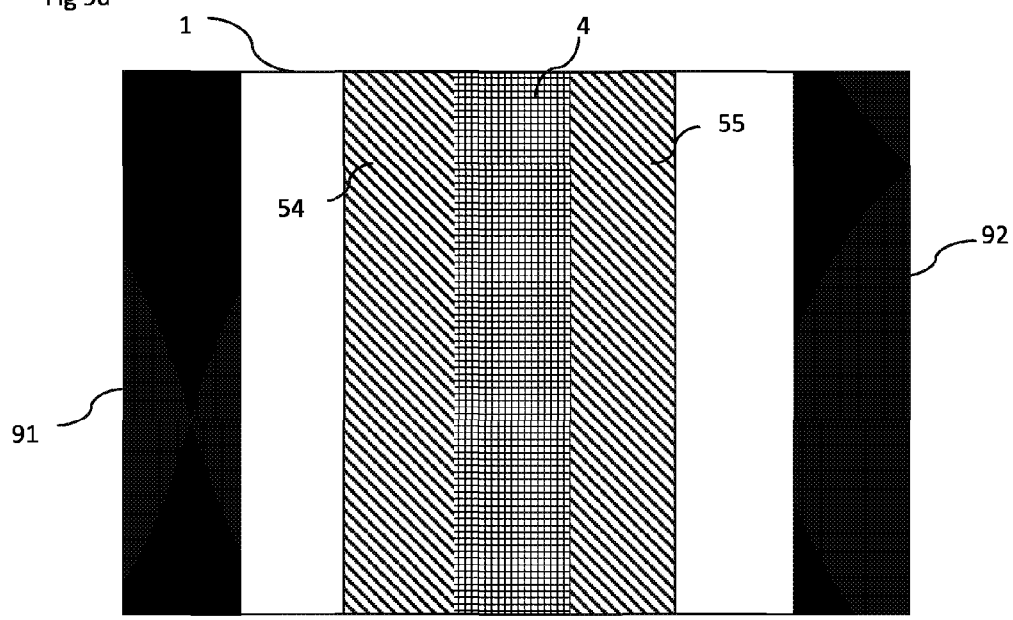
Figure 9E:
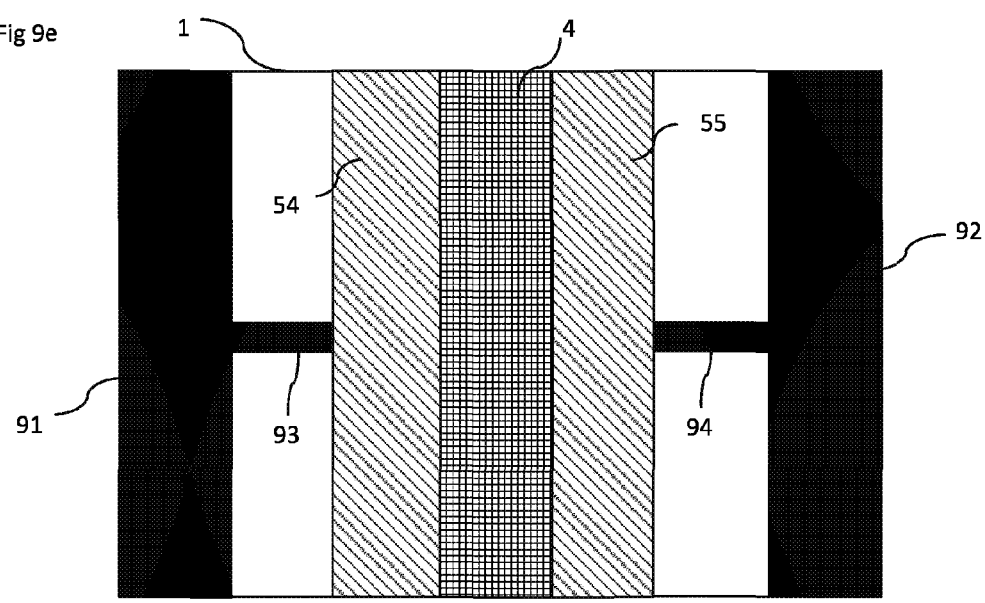
Figure 9F:
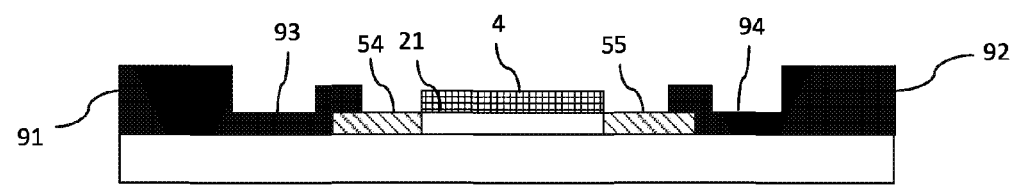
Figure 10A:
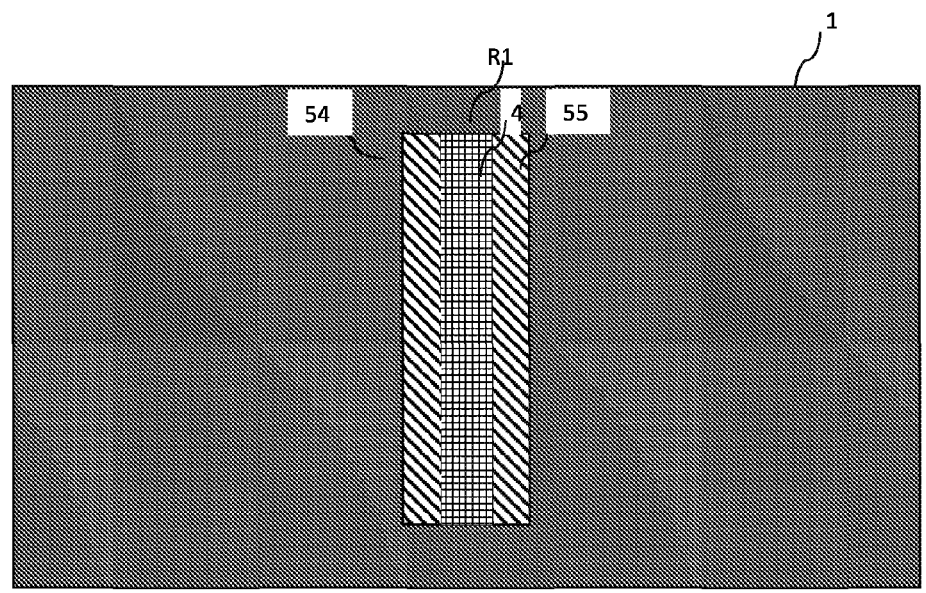
FIG. 10 illustrates steps in a process to produce a printed rectifier integrated with an antenna produced in a method embodying the invention.
Figure 10B:
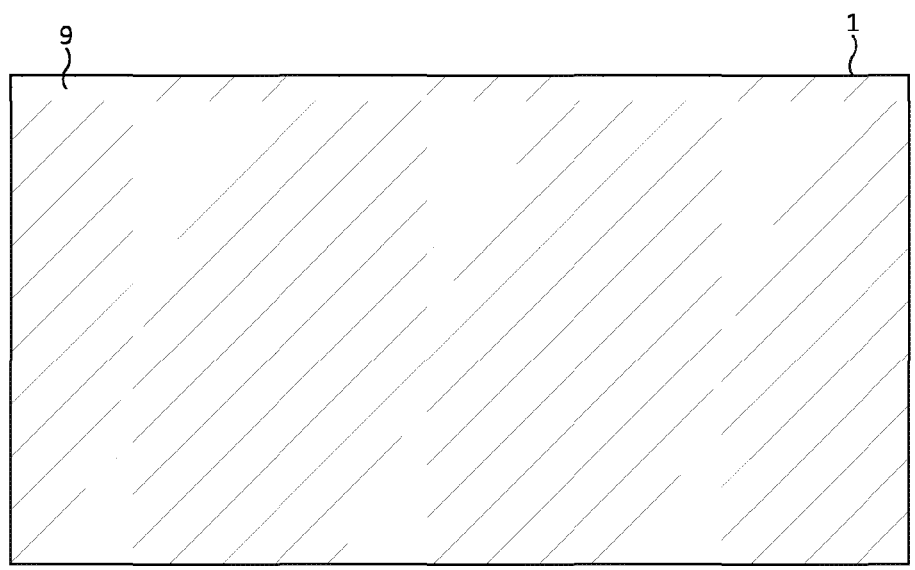
Figure 10C:
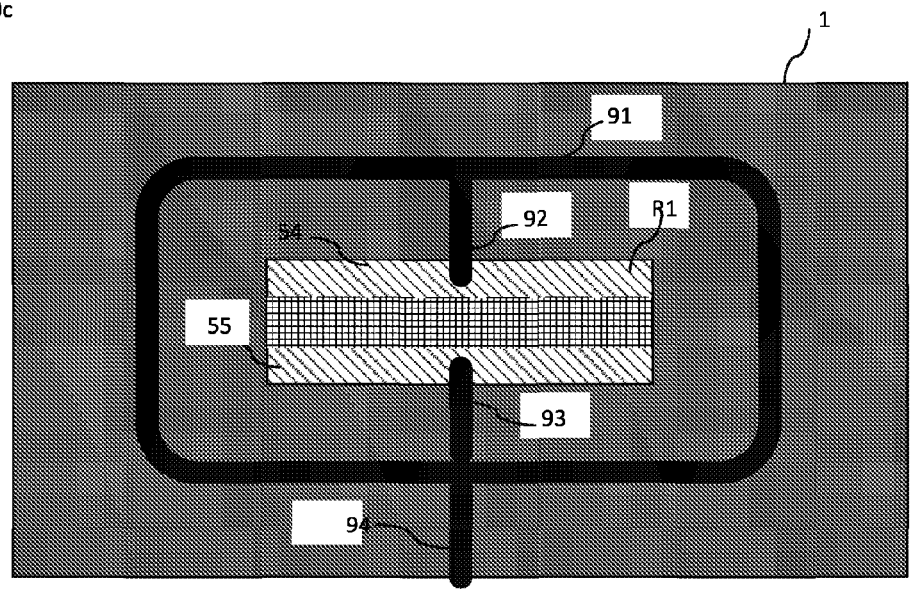
Figure 10D:
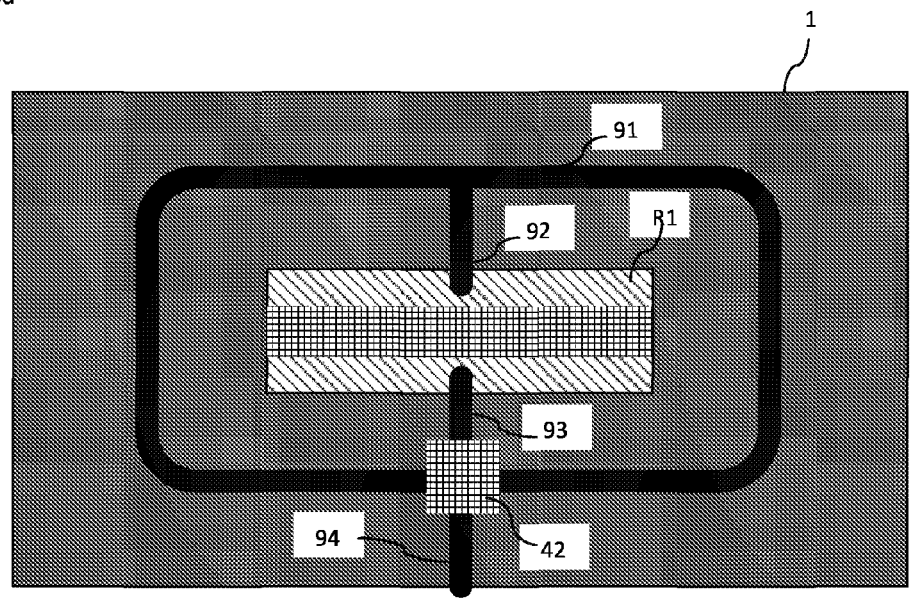
Figure 10E:
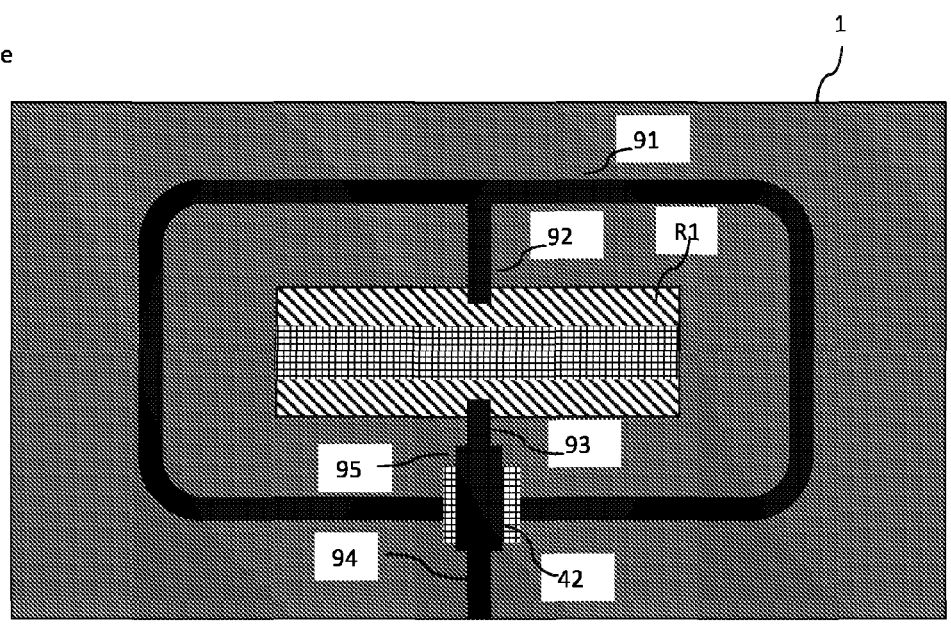

Referring now to FIG. 10 this illustrates a series of step to construct an integrated radio-frequency rectifier and antenna via a method embodying the invention. FIG. 10a shows a rectifier circuit R1 as depicted in FIG. 9c. In FIG. 10b a covering of metal 9 has been deposited over the entire substrate 1. FIG. 10c shows a further step where a mask has been used to selectively etch away metal around rectifier circuit R1, leaving a loop antenna structure 91, connected to source region 54 via interconnection 92. Drain region 55 has an incomplete interconnection 93 which ends before loop antenna 91. An additional interconnection 94 continues along the same path as 94 from the opposite side of loop antenna 91. In FIG. 10d a layer of dielectric material 42 has been deposited over loop antenna 91, interconnection 94 and interconnection 95. In FIG. 10e an additional layer of conductive material 95 has been deposited over dielectric material 42 to join interconnection 94 with interconnection 95, thus creating a continuous conductive pathway. The structure is now an energy harvesting device capable of converting radio-frequency input into direct-current through rectifier circuit R1. Interconnection 94 provides an output connection to an additional device, such as a display (LCD, electrochromic, electrophoretic), OLED or LED.

Referring now to FIG. 11, FIG. 11a is a schematic plan view of a structure comprising a substrate 1, a semiconductor layer 2 supported by the substrate, and a patterned layer of resist material 3 formed over the semiconductor layer in a method embodying the invention. The resist layer 3 has been patterned such that it comprises regions having three different thicknesses. A first region R1 comprises a perimeter first portion R1a, which defines a perimeter or extent of the planar electronic device being manufactured, a first portion R1b defining the position of a gate terminal at one side of the device semiconductor channel, and another first portion R1c defining another gate terminal, on the opposite side of the semiconductor channel. As will be appreciated, in this example the plurality of first portions are connected together, such that they form integral parts of the first region R1. However, in alternative embodiments, one or more of the first portions may be separate from one another. In this first example, these first portions R1a, R1b, and R1c, of the patterned layer of resist material each have a first thickness t1. These first portions define the positions of insulative features to be formed to interrupt the underlying layer of semiconductor material and define the position of the semiconductor channel. As will be appreciated, FIG. 11a is schematic, and in certain embodiments the relative dimensions of the various features, such as the widths of the insulative features and the dimensions of the channel and terminal regions may differ from those shown in the figure. The layer of resist material also comprises a central second portion R2a and a surrounding second portion R2b, each of these second portions having a second thickness t2 which is greater than the first thickness t1. The central second portion covers the semiconductor channel of the eventual device, and the outer second portion surrounds the device as a whole. The layer of resist material also comprises a plurality of third portions, each having a third thickness t3, which is greater than thickness t2, these third portions including third portion R3a defining the position of a source terminal, third portion R3b, defining the position of a drain terminal, third portion R3c, defining a first side gate terminal on one side of the semiconductor channel, and third portion R3d defining a second gate terminal on the opposite side of the semiconductor channel. As will be appreciated, the patterned resist layer, with regions having a plurality of different heights, in FIG. 11a can be produced using a variety of techniques. In certain embodiments, the multi-height structure can be produced using etching or micro-machining techniques. However, in alternative embodiments an imprint tool or stamp can be used to provide the patterned surface profile. For example, the resist layer may be formed while the imprint tool or stamp is positioned with respect to the semiconductor layer 2 so that the resist material fills in the space between the tool and semiconductor layer, and is then cured or otherwise set such that when the tool is removed, the multi-height patterned profile of the resist layer is maintained.

Referring now to FIG. 11b, this shows a cross section of the structure of FIG. 11a, taken along stepped line A-A.

After producing the structure shown in FIG. 11b, a next step in the method embodying the invention is the processing of the layer of resist material 3 to remove the first portions R1a, Rib, and Ric, without removing entirely the second or third portions, to expose surfaces of corresponding underlying first portions of the semiconductor layer 2. The resultant structure is shown in FIG. 11c. Next, the method of this particular embodiment comprises the removal of these first portions of the semiconductor layer 2 to expose surfaces of corresponding underlying first portions of the substrate 1 and so form a plurality of insulative features 9 interrupting the semiconductor layer 2, these insulative features defining the position of the semiconductor channel and also, in this embodiment, defining the boundaries of the various device terminals. The resultant structure is shown in FIG. 11d. The formation of the insulative features has divided the semiconductor layer into a channel region 21, a source region 22, a drain region 23, gate regions (not shown) and a surrounding region 200.

A next step comprises further processing the layer of resist material 3 to remove entirely the second portions R2a, R2b of the layer of resist material, without removing entirely the third portions R3a, R3b, R3c, and R3d, to expose at least a surface of a second portion of the semiconductor layer which provides the channel 21. The resultant structure is shown in FIG. 11e. In this embodiment, removal of the second portions of resist layer has exposed upper surfaces of the channel region 21 and surrounding region 200.

Then, the method in accordance with this embodiment comprises depositing dielectric material 4 on the structure of FIG. 11e, such that dielectric material fills the insulative features 9 and forms a dielectric layer covering at least the semiconductor channel 21. In this embodiment, the dielectric layer 4 also covers the region 200 of semiconductor material surrounding the device, as bounded by the insulative perimeter defined by R1a. The dielectric layer also covers the remaining portions of the third portions R3a, R3b of the resist layer. The resultant structure is shown in FIG. 11f.

Finally, the remaining resist material is removed, taking with it the overlying dielectric material 4, yielding the structure shown in FIG. 11g, in which the semiconductor channel 21 is covered by a layer of dielectric material 4. The dielectric material 4 also fills the insulative features 9, but regions 22 and 23 of semiconductor material are left exposed, as are the regions providing the gate terminals (not shown). These areas 22 and 23 can therefore be used directly as terminals of the device, and electrical connections may be made directly to them. Alternatively, these regions 22 and 23 may be processed to increase their conductivity, as described below. Also, in alternative embodiments, layers of conductive material may be selectively provided on the upper surfaces of regions 22 and 23 (as described below) and electrical connections may then be made to those conductive layers.

Figure 12A:
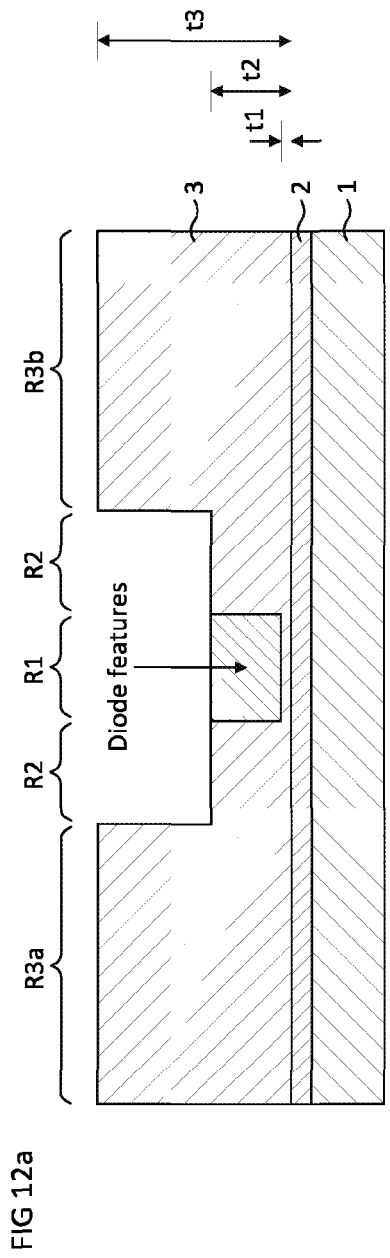
Figure 12B:
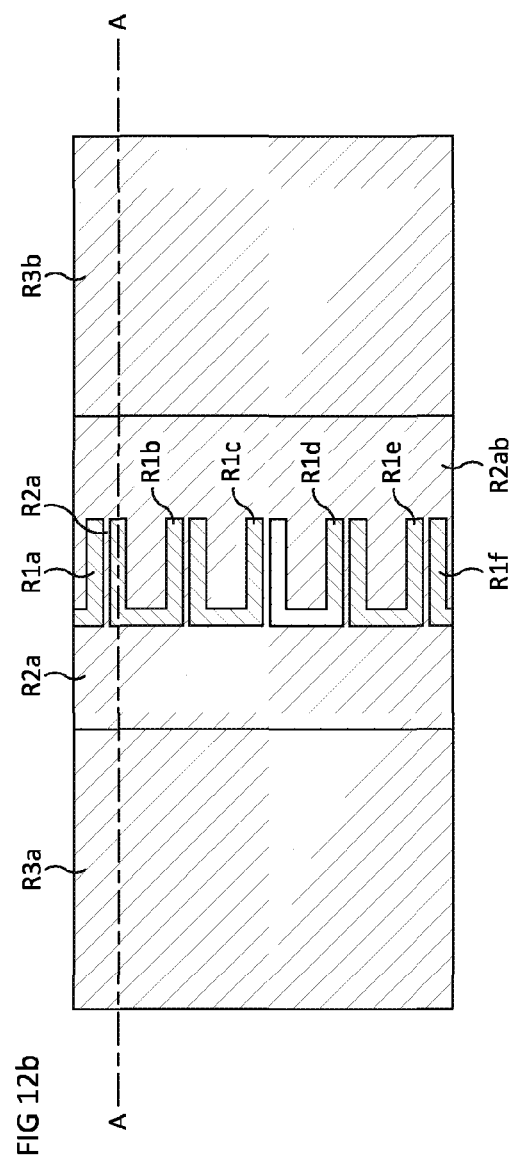
Figure 12C:
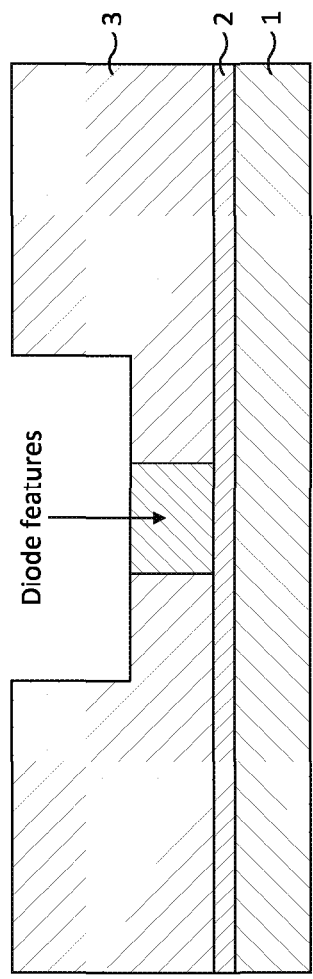
Figure 12D:
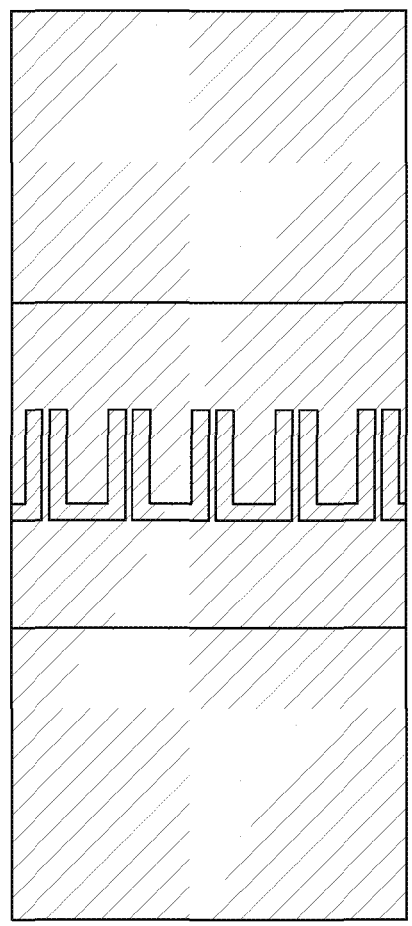
Figure 12E:
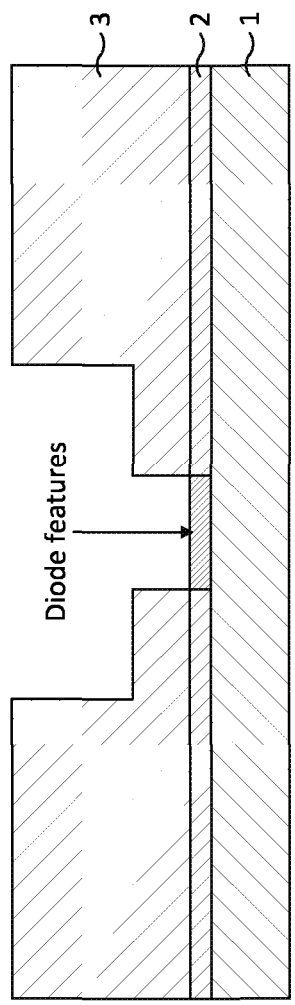

Referring now to FIGS. 12a-12l, these show steps in a method embodying the invention for manufacturing a substantially planar diode, the diode also embodying the invention. FIG. 12b shows a plan view of a structure formed early in the method, and FIG. 12a is a schematic cross section of the structure of 12b along line A-A. The illustrated structure comprises a substrate 1 supporting a layer of semiconductor material 2, and a patterned layer of resist material 3 has been formed over the semiconductor 2. The resist layer 3 has been patterned such that it comprises regions having different thicknesses, these regions generally being defined as region R1 having a first thickness, region R2 having a second thickness, and region R3 having a third thickness. Region R1 generally defines the pattern of insulative features to be formed in the semiconductor layer to form the diode. Region R1 comprises a plurality of first portions R1a-R1f, each of these first portions defining a separate insulative feature, and gaps or channels between the adjacent first portions defining the positions of semiconductor channels to be formed in the eventual diode. The second region R2 comprises a second portion R2aa which covers a portion of the semiconductor layer at one end of the semiconductor channels on the eventual diode, another second portion R2ab which covers a portion of the semiconductor layer 2 at the opposite end of the semiconductor channels, and a plurality of further second portions R2a, each covering a respective portion of the semiconductor layer 2 which will form one of the semiconductive channels in the eventual device. The third region R3 comprises a third portion R3a which covers a portion of the semiconductor layer 2 which will eventually form one terminal of the diode, and another third portion R3b which covers a region of the semiconductor layer that will form a second terminal of the eventual device. In this method embodying the invention, an etching step is performed on the structure shown in FIGS. 12a and 12b to etch away some of the layer of resist material 3 such that the trenches R1a-R2f are deepened until underlying portions of the semiconductor layer 2 are exposed. This etching results in the structure shown in FIG. 12d, and the corresponding schematic cross section in FIG. 12c. As will be appreciated, the etching process, in addition to exposing semiconductor material at the bottom of the deepest trenches, also may result in removal of resist material from the second and third regions, such that they are also thinned, but not removed entirely.

Figure 12F:
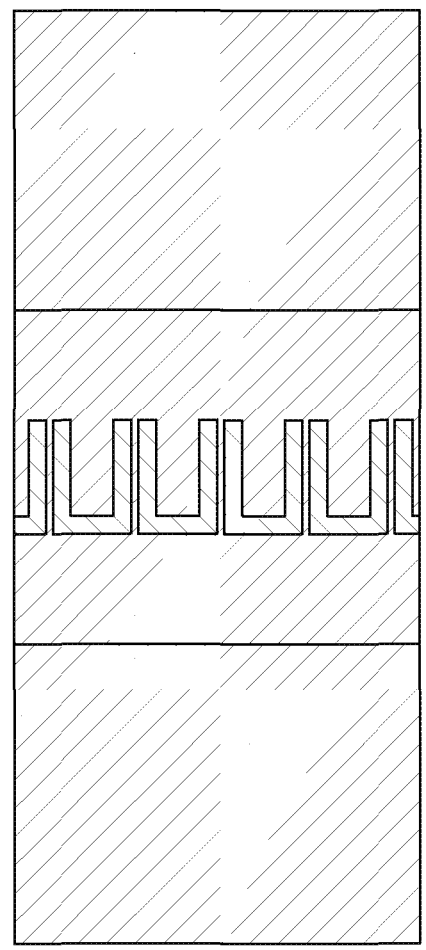

Next, a further etching step is performed to remove the semiconductor material exposed by the development of the trenches in the above-mentioned step. The exposed portions of semiconductor material are removed entirely, such that corresponding underlying regions of the substrate surface are exposed. The resultant structure is shown in FIGS. 12f (plan view) and 12e (schematic cross section). In this way, insulative features have been formed in the semiconductor layer 2, each of these insulative features completely interrupting the semiconductor layer, and providing a barrier to electrical current flow across each feature. In this particular embodiment, the etching process to remove the semiconductor material has also resulted in further thinning of the resist layer 3. However, it will be appreciated that, in alternative embodiments, different etch techniques may be used so that just the semiconductor material is removed in this step, the resist layer 3 being unaffected.

Moving on to FIGS. 12g and 12h, these show the cross section and top view respectively of the structure resulting from a further step in the method, in which the resist layer 3 has been etched further so that the second region R2 has been completely removed, so as to expose corresponding surfaces of the underlying layer of semiconductor material 2, whilst leaving at least some of the third region R3 in place. In other words, the etching has exposed portions of the semiconductor layer which form the semiconductor channels and also portions of the semiconductor layer immediately adjacent each end of each channel, but a thickness of resist material 3 still covers the areas of semiconductor layer that will form the eventual device terminals.

Figure 12I:
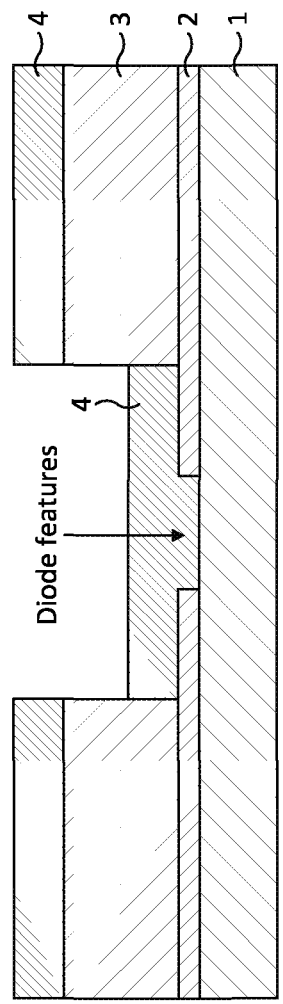

Then, in a further step of the method, dielectric material is deposited over the structure shown in FIGS. 12g and 12h, to yield the structure shown in FIGS. 12i (cross section) and 12j (top view). Thus, dielectric material fills the insulative features which interrupted the semiconductor layer. Dielectric material covers the semiconductor channels and the portions of the semiconductor layer immediately adjacent the ends of each channel. Furthermore, dielectric material covers the remaining portions of resist material 3, which cover the areas designated as the eventual terminals of the device.

Figure 12J:
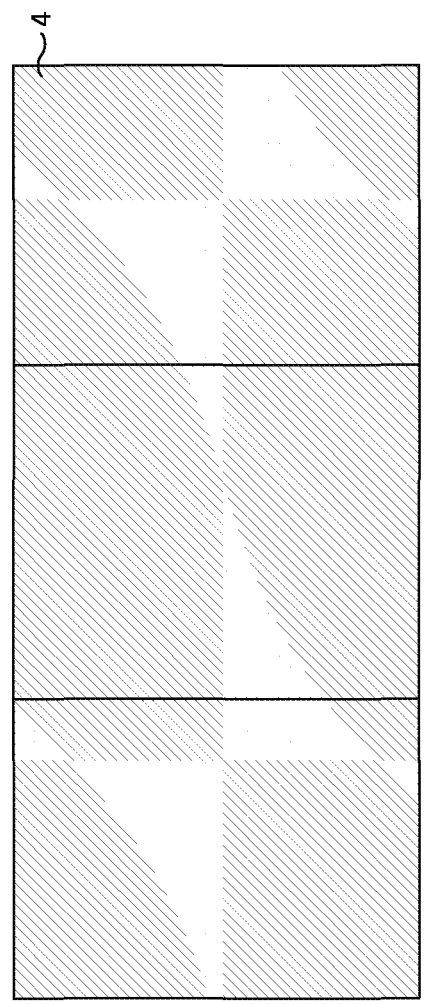
Figure 12K:
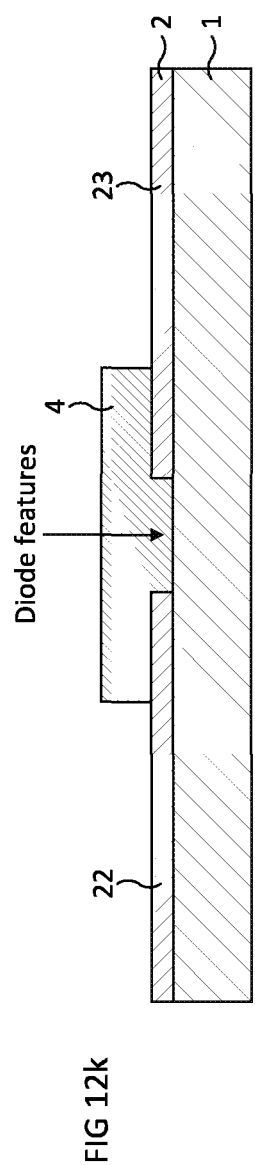
Figure 12L:
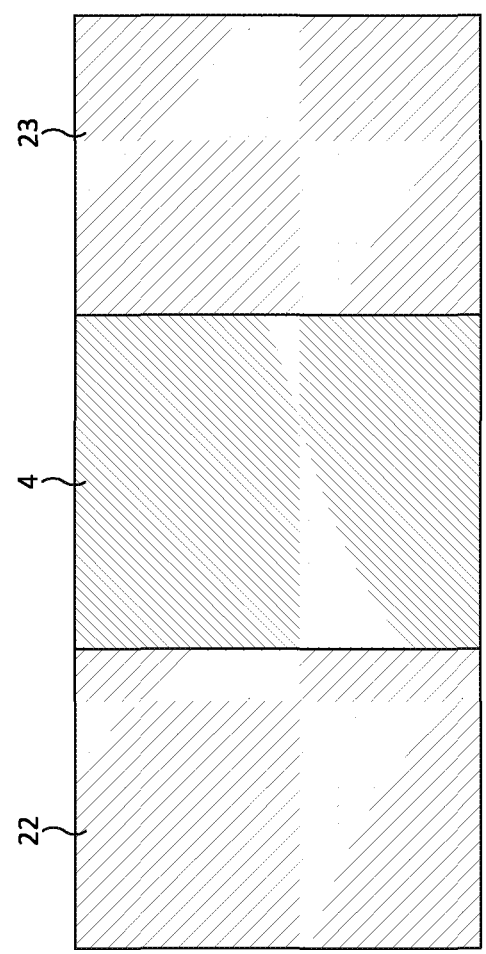

Next, the structure of FIGS. 12i and 12j is processed to remove (e.g. by lift-off) the remaining resist material 3, and in doing so the dielectric material 4 covering the resist material 3 is also removed, yielding the structure shown in FIGS. 12k (cross section) and 12l (top view). In certain embodiments the exposed portions 22 and 23 of the dielectric layer 2 can be used as the terminals of the diode. However, in alternative embodiments these exposed portions may be processed further to increase their conductivity in order to form the terminal regions of the device, or layers of conductive material can be formed on them to form terminals of the device. For example, in certain embodiments the exposed regions of semiconductor material 22, 23 may be annealed to increase their conductivities. Laser annealing may be used in certain embodiments, in which case the dielectric material 4 may be coated with a metal or other suitably reflective material before the laser annealing such that the coating reflects the radiation to which the structure is exposed, and the un-coated exposed portions of semiconductor layer 2 are selectively annealed. In a related technique, instead of coating the dielectric with reflective layer, an opaque dielectric material may be used, which absorbs the radiation used for annealing purposes. Again, such a technique results in the selective annealing of the exposed portions of semiconductor layer 2, leaving the semiconductive channels, and optional further regions of semiconductor layer 2 covered by dielectric material, substantially unaffected (i.e. it still remains semiconductive).

Conductive layers, contacts, or coatings can be produced on the exposed regions of the semiconductor layer 2 by a variety of techniques in different embodiments of the invention. For example, selective deposition of conductive material on the exposed portions of semiconductor 2 is achieved in certain embodiments by forming a hydrophobic coating on the dielectric layer, and subsequent placement of conductive inks onto the structure. The hydrophobic coating repels the conductive ink from the regions of the structure covered by the dielectric layer, and so the conductive ink is selectively deposited on the exposed regions of semiconductor material. In certain embodiments, the hydrophobic coating is transferred onto the dielectric layer from a film. In alternative embodiments, the hydrophobic coating may be coated onto the dielectric before the lift off step, which remaining portions of the resist layer 3 and dielectric material covering those portions, are removed. In certain embodiments, conductive layers may be formed on the exposed portions of semiconductor 2 by electroforming, or by chemical vapour deposition (CVD) techniques, using, for example, Cupraselect™, or Gigacopper™.

Figure 13:
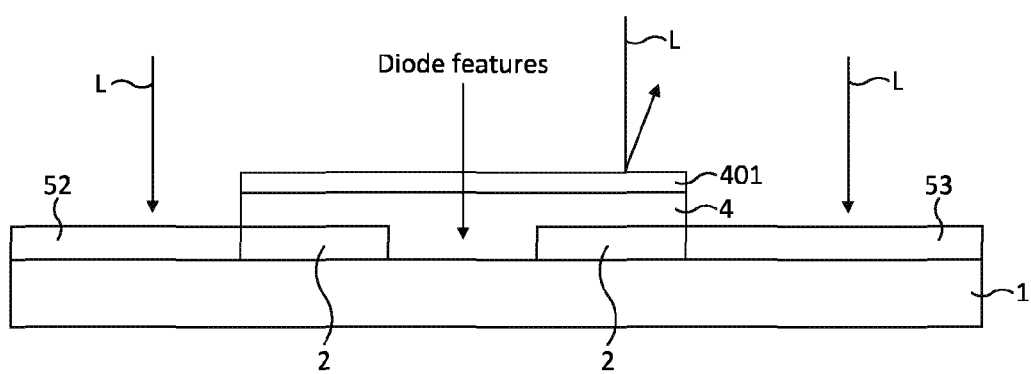
FIG. 13 illustrates a step in another method of manufacturing an electronic device embodying the invention.

Referring now to FIG. 13, this is a schematic cross section of a structure undergoing a processing step in a method embodying the invention. The structure comprises a basic device structure as shown in FIG. 12k described above. Additionally, the structure comprises a reflective layer 401 formed over the dielectric layer 4 which covers the insulative features and certain portions of the underlying semiconductor layer 2. This reflective layer, which may also be described as a protective layer, can be formed from a variety of materials, for example aluminium, which can be formed over the structure of FIG. 12i in certain embodiments, such that when the remaining resist material 3 is removed, the portions of the aluminium layer over those resist regions 3 are also removed, leaving the protective layer just positioned over the dielectric 4 which covers the insulative features and adjacent portions of the semiconductor layer 2. In alternative embodiments, however, the reflective layer 401 can be formed at a later stage, for example on the structure of FIG. 12k. In FIG. 13, radiation, in this case laser radiation L, is being directed at the structure. The protective layer 401 over the dielectric layer 4 is arranged to reflect substantially all of the incident radiation. However, the exposed portions of initially semiconductor material 2, which are not covered by the protective layer, absorb the radiation and are therefore selectively heated. The supply of laser radiation is arranged such that this selective heating results in annealing of the exposed portions of initially semiconductive material, which increases their conductivity to the extent that those regions become substantially conducting regions 52 and 53, which provide the terminals of the device. After the laser annealing, in certain embodiments the protective layer may be removed, using appropriate techniques.

Figure 14:
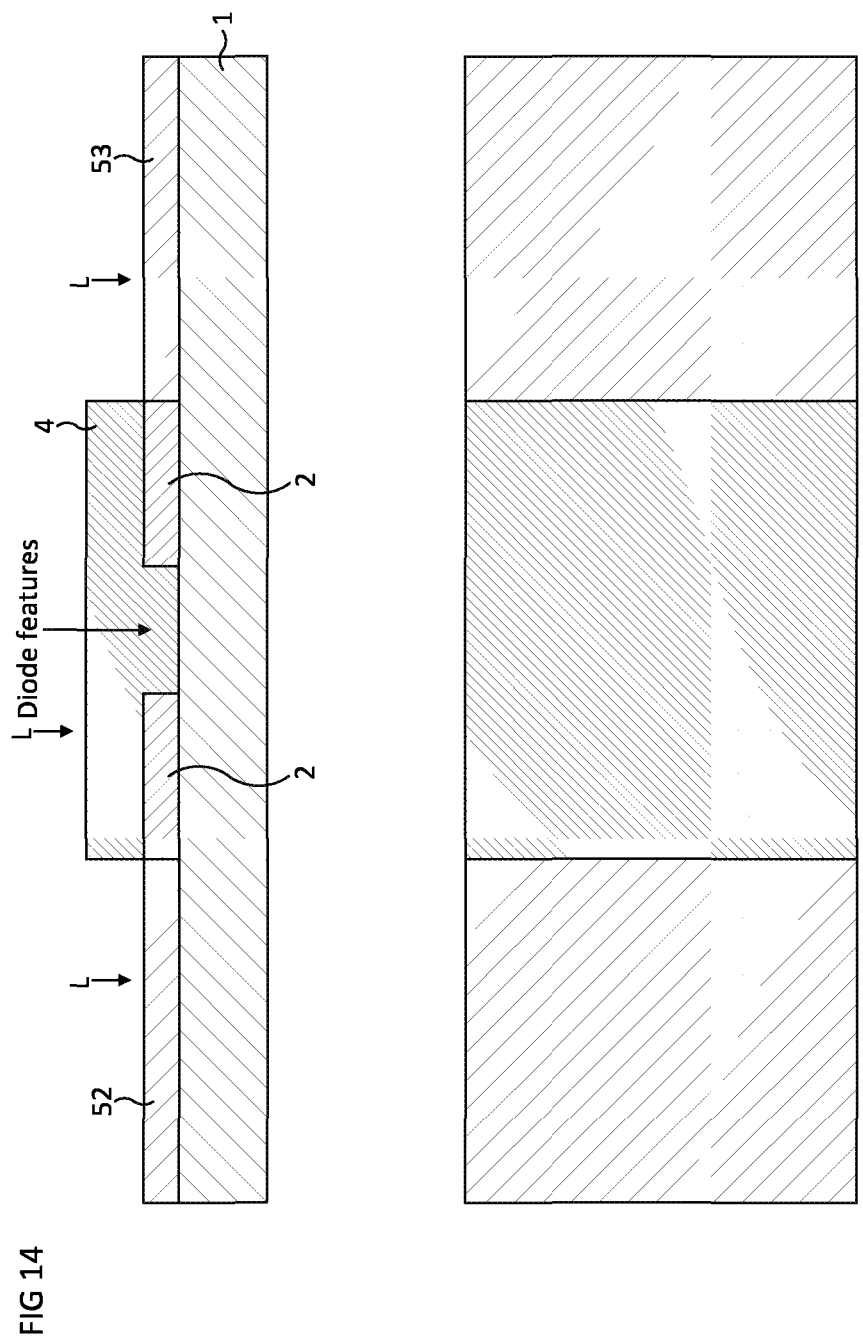
FIG. 14 illustrates a step in another method embodying the invention.

FIG. 14 illustrates an alternative structure being subjected to a laser annealing step in a method embodying the invention. Here, rather than the dielectric layer having a protective, reflective layer formed on it, the dielectric material is selected so that it is substantially opaque to the radiation directed at the structure for annealing purposes. For example, in certain embodiments the radiation L may substantially comprise wavelengths in the ultraviolet (UV) range, and the dielectric material 4 may be UV opaque. Thus, on exposure of the structure to UV radiation, the dielectric absorbs the radiation, preventing it from reaching the underlying portions of semiconductor material, whereas the exposed portions of originally semiconductor material are subjected to the UV radiation, resulting in their selective heating, annealing, and conversion of their material to substantially conductive material, forming conductive terminals 52 and 53.

Figure 15:
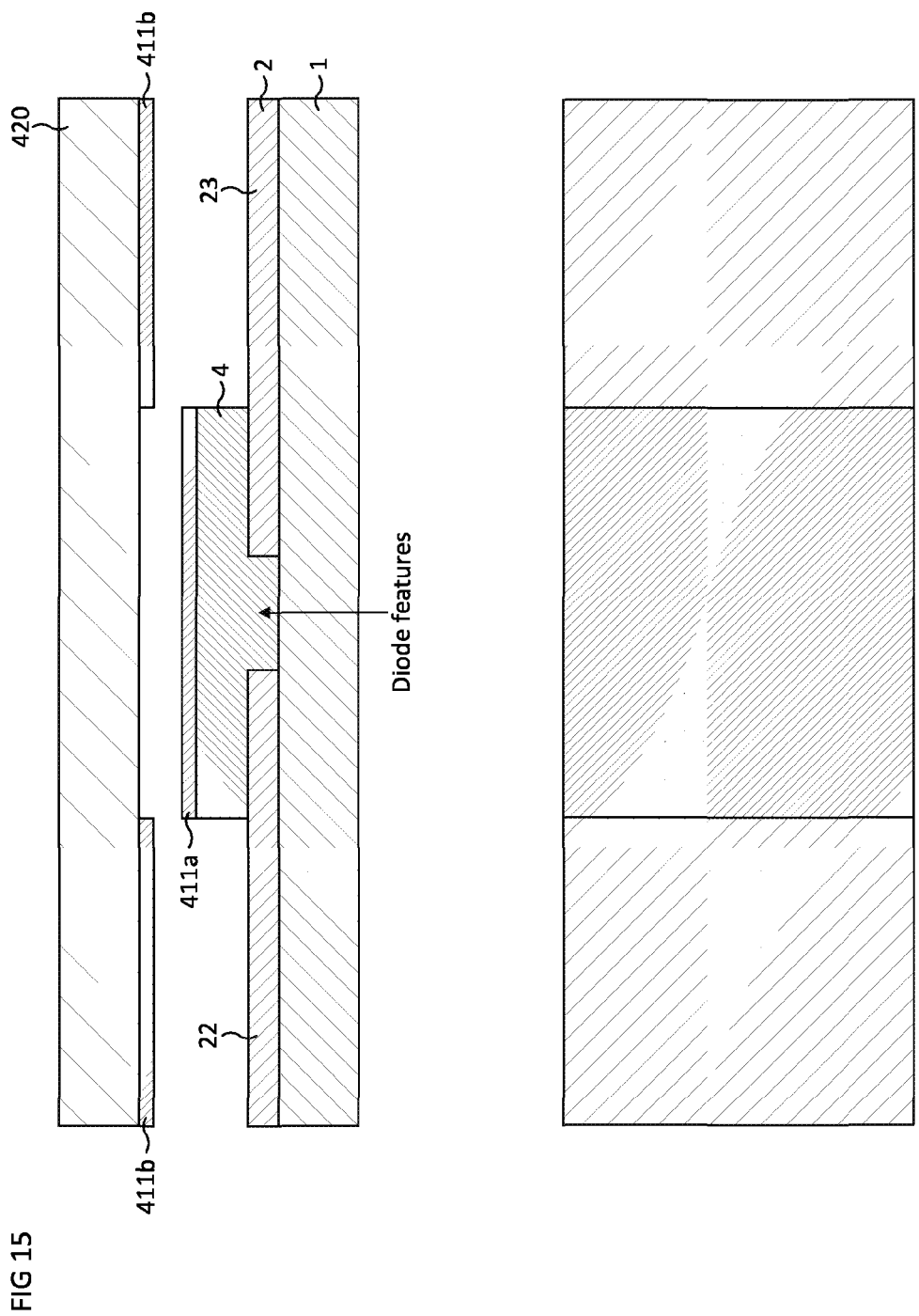
FIG. 15 illustrates a step in another method embodying the invention.
Figure 16:
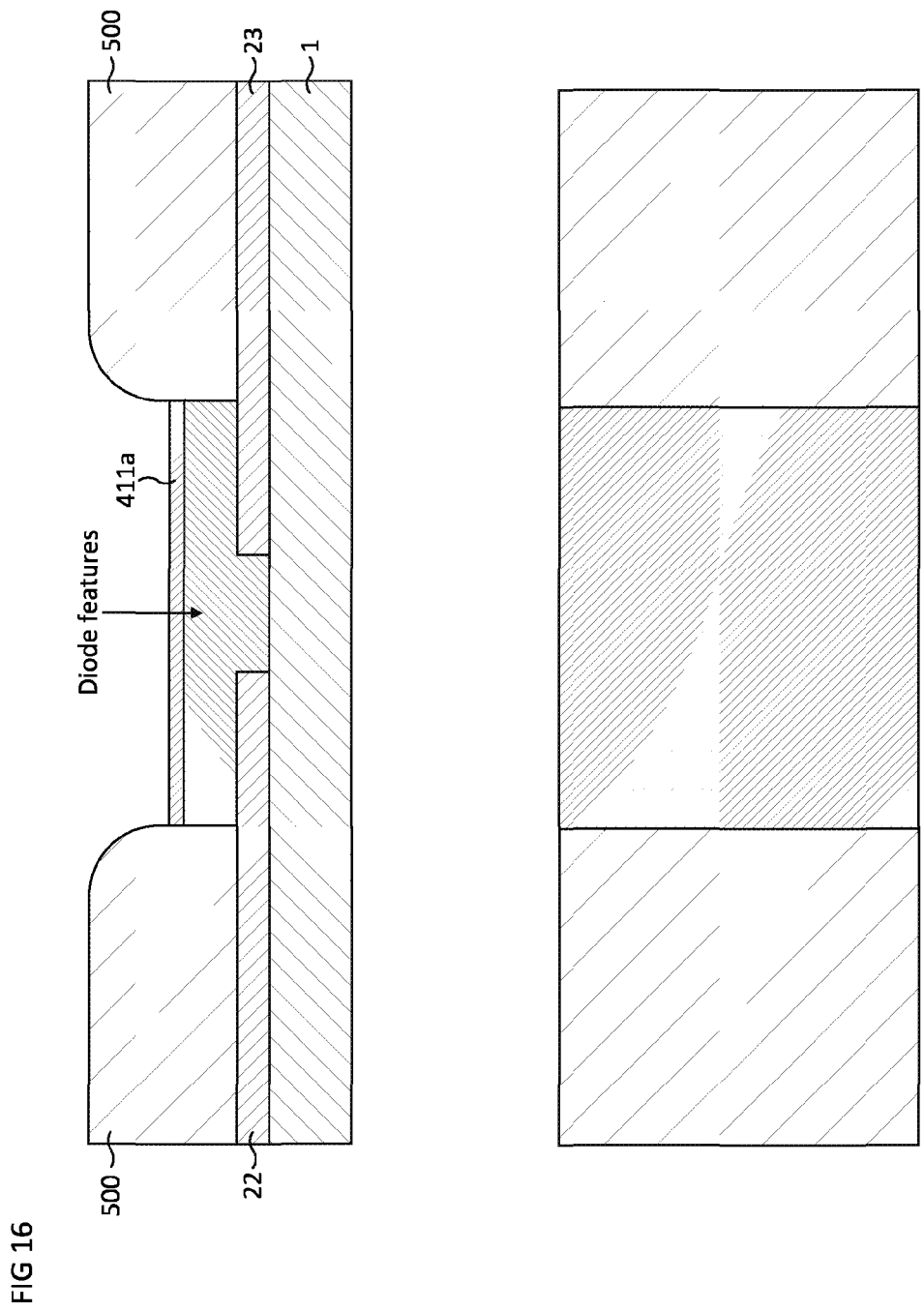
FIG. 16 illustrates a step in another method embodying the invention.

Referring now to FIG. 15, this is a schematic cross section illustrating a step in the manufacture of another electronic device embodying the invention. A structure substantially the same as the structure shown in FIG. 12k has had a layer of hydrophobic material formed on the dielectric layer 4. In this example, the hydrophobic material 411 has been supplied on a carrier in the form of a transfer film 420. The transfer film has been brought into contact with the device structure such that a portion 411a of the hydrophobic material carried by the film has been transferred onto the dielectric 4, leaving portions 411b of hydrophobic material remaining on the transfer film. Next, as illustrated in FIG. 16, metal ink 500 has been supplied to the structure, such that the metal ink is deposited on the areas of the structure without a hydrophobic coating. Thus, the metal ink 500 has been repelled from the regions covered by dielectric material 4 and hydrophobic coating 411a, but has wetted and coated exposed portions of the semiconductor layer 22, 23. The metal ink may be deposited using a variety of techniques, including, for example, inkjet printing (for example with a drop-diameter of 30 micrometers), and by aerosol jet techniques, for example using a drop-diameter of between 1 and 5 micrometers.

Figure 17:
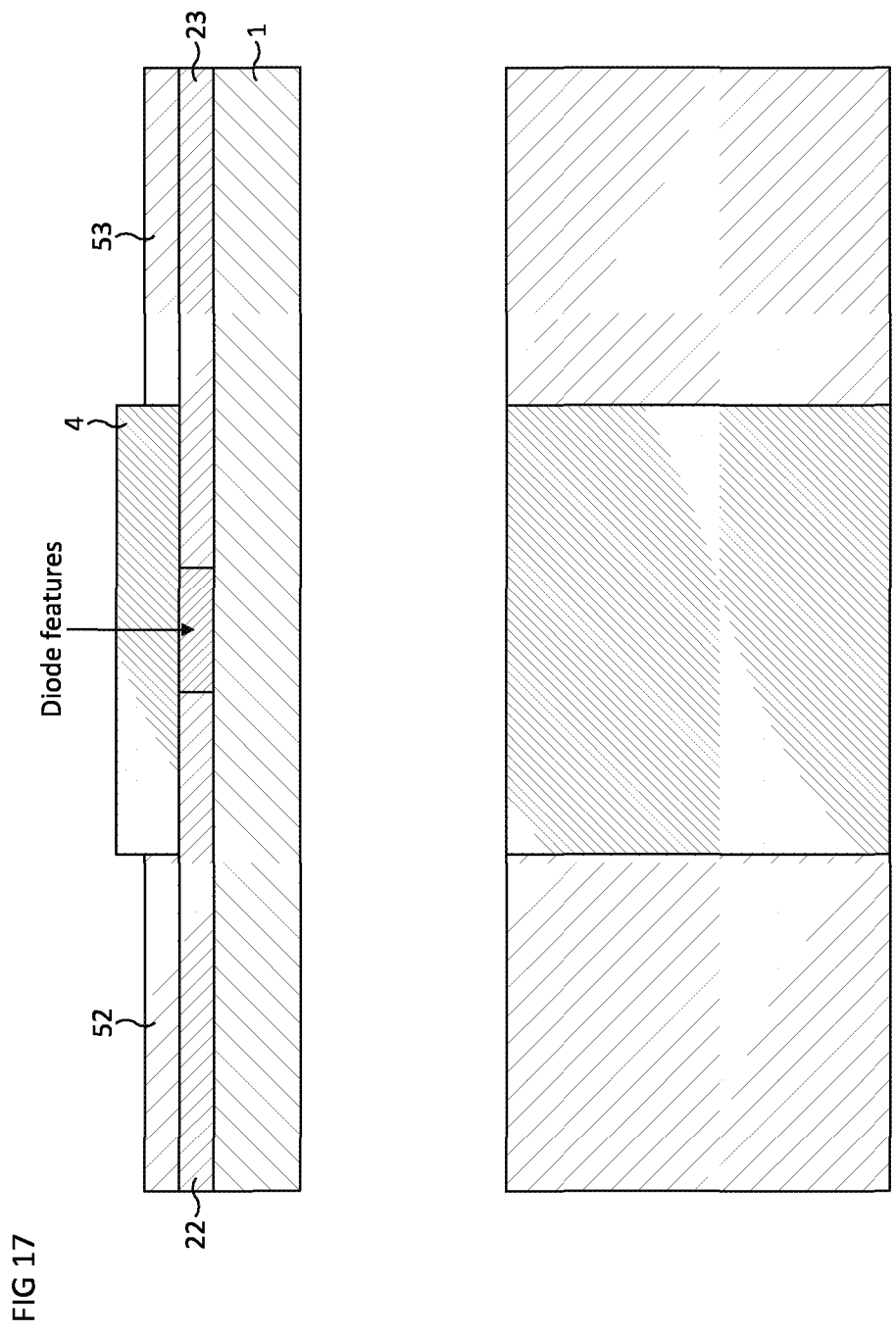
FIG. 17 illustrates another step in a method embodying the invention.

FIG. 17 illustrates an alternative device structure embodying the invention, and having been formed by a method embodying the invention. Here, conductive layers 52, 53 have been formed over the semiconductor material regions 22 and 23 by electroforming techniques or CVD techniques.

In certain embodiments the imprint features used to pattern the initial imprint layer or layers have a height of 500 nanometers or greater.

In certain embodiments, techniques are used which provide no selectivity between the etching of resist and semiconductor material. In certain embodiments, the resist lateral etch is as fast as the vertical etch. In certain embodiments, the initial imprint is used to define a residual layer having a thickness of approximately 50 nanometers (i.e. the first thickness, T1, is approximately 50 nanometers in certain embodiments. In certain embodiments, the method results in a residual layer of thickness approximately 100 nanometers after the semiconductor etch. In certain embodiments, the thickness of the dielectric layer is approximately 100 nanometers. In certain embodiments using lift-off resist materials, a 200 nanometer minimum cliff is required in the resist material (in certain embodiments the lift-off resist is approximately 2-3 times the thickness of the dielectric).

Figure 18:
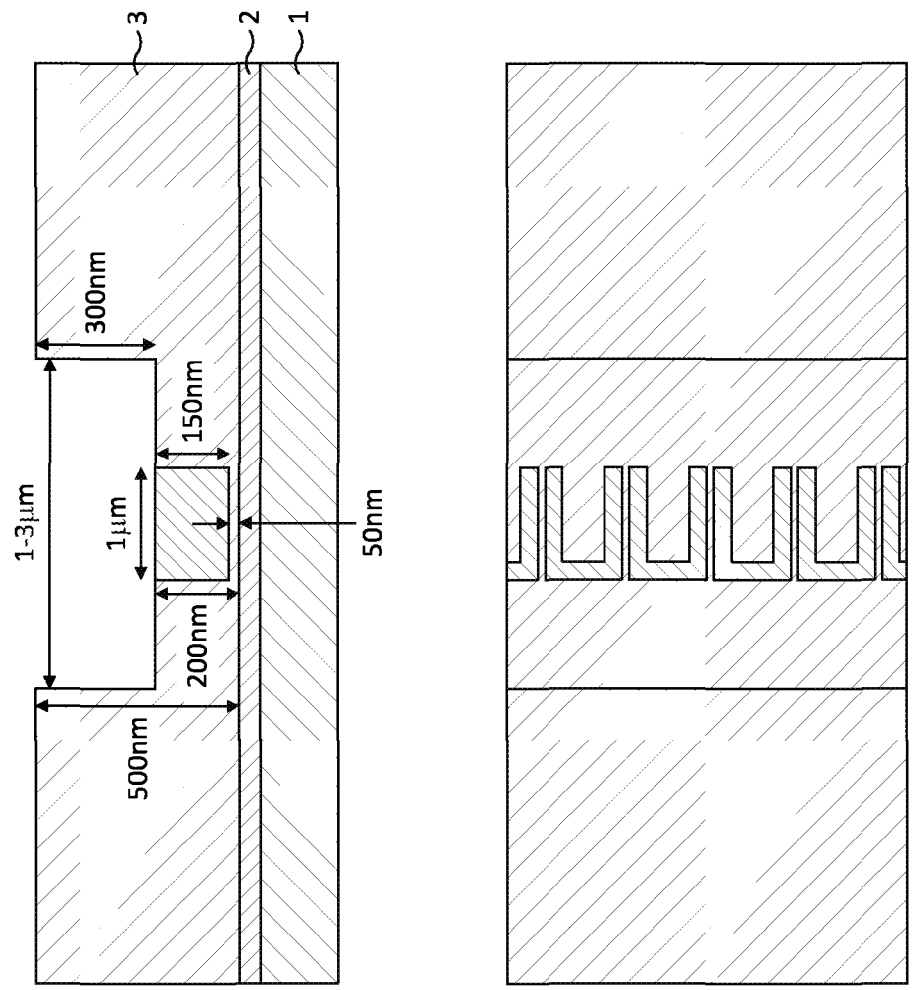
FIG. 18 illustrates some typical feature dimensions of features produced in certain embodiments of the invention.

FIG. 18 is a schematic representation of a structure formed during a method embodying the invention, showing typical dimensions of certain features. As will be seen, in this embodiment T1 is approximately 50 nanometers, T2 is approximately 200 nanometers, and T3 is approximately 500 nanometers. However, it will be appreciated that these thicknesses and dimensions are merely examples, and other thicknesses and dimensions may be employed in alternative embodiments of the invention.

Referring now to FIGS. 19a-19p, these illustrate steps in another method of manufacturing a substantially planar electronic device embodying the invention. In this embodiment, a substrate 1 is provided which supports a layer of semiconductor material 2, and a layer of conductor material 5 is provided over the semiconductor layer 2. A layer of resist material 3 is formed over the multi-layer structure of conductor, semiconductor, and substrate, that resist layer comprising a plurality of different regions having different thicknesses. The patterned resist layer can be formed using techniques as described above in relation to other embodiments. In this example, the resist layer comprises a first region R1 having a first thickness T1, that first region comprising a plurality of first portions R1a-R1f, each of which defines a position of an insulative feature to be formed in the eventual device. The resist layer 3 comprises a second region R2 having a second thickness, which comprises second portions R2a, each covering a respective portion of the semiconductor layer that will form a conductive channel in the eventual device, a second portion R2aa covering a region of semiconductor material at one end of the semiconductive channels, and another portion R2ab covering a portion of the semiconductor layer at an opposite end of the semiconductive channels. Region R3 comprises a third portion R3a covering a portion of the conductor layer and underlying semiconductor layer that will eventually form a first terminal of the device, and another third portion R3b covering a portion of the conductor layer and underlying semiconductor layer that will eventually form the second terminal of the device.

Figure 19C:
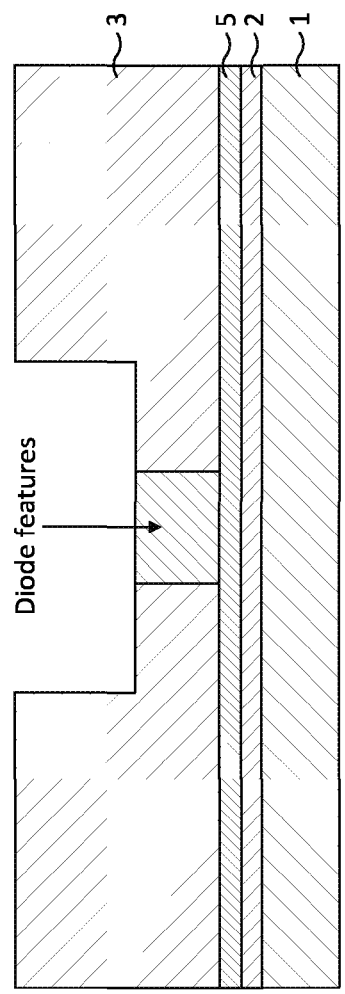
FIGS. 19a-19p illustrate steps in another method embodying the invention for manufacturing a substantially planar electronic device.
Figure 19D:
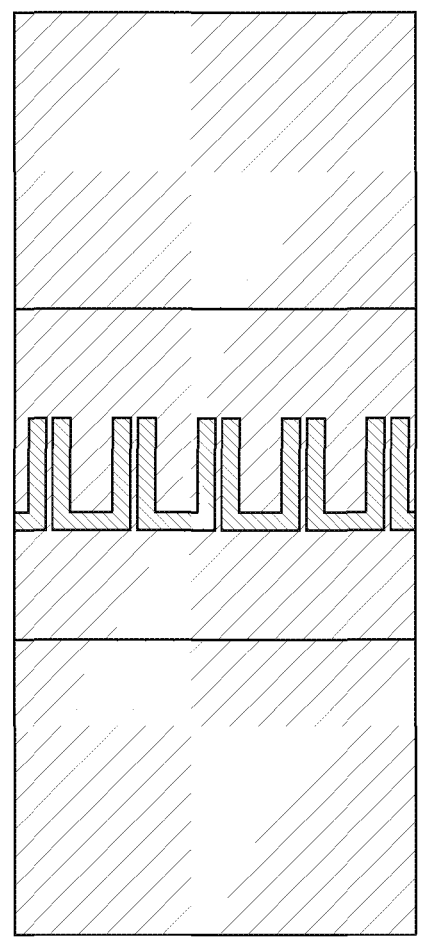

The structure of FIGS. 19a and b is then processed (e.g. by etching) to remove some resist material and deepen the trenches (corresponding to the first region R1) until underlying portions of the conductor layer 5 are exposed, yielding the structure shown in FIGS. 19c (cross section) and 19d (top view).

Figure 19E:
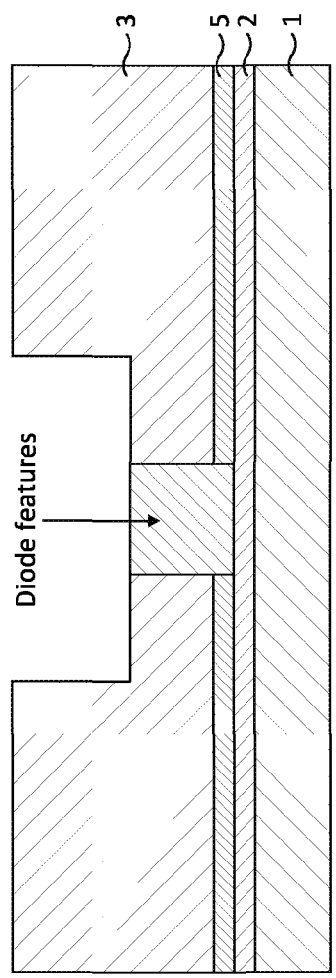
Figure 19F:
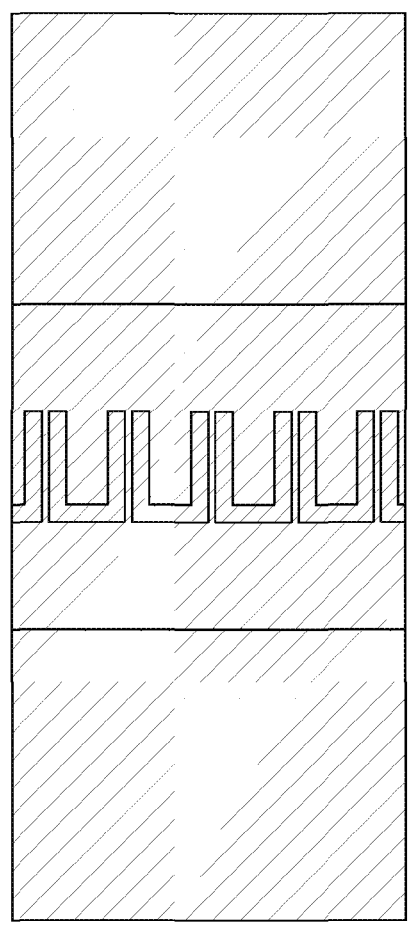

Then, the structure is processed further to remove the conductor material at the base of these developed trenches, exposing portions of the underlying semiconductor layer, yielding the structure shown in FIGS. 19e (cross section) and 19f (top view).

Figure 19G:
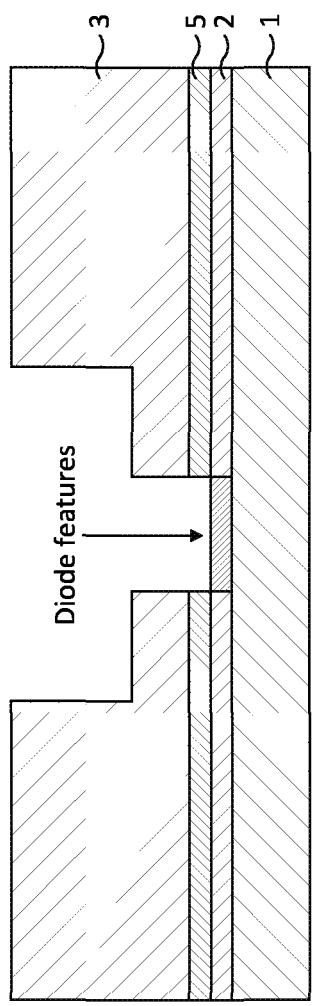
Figure 19H:
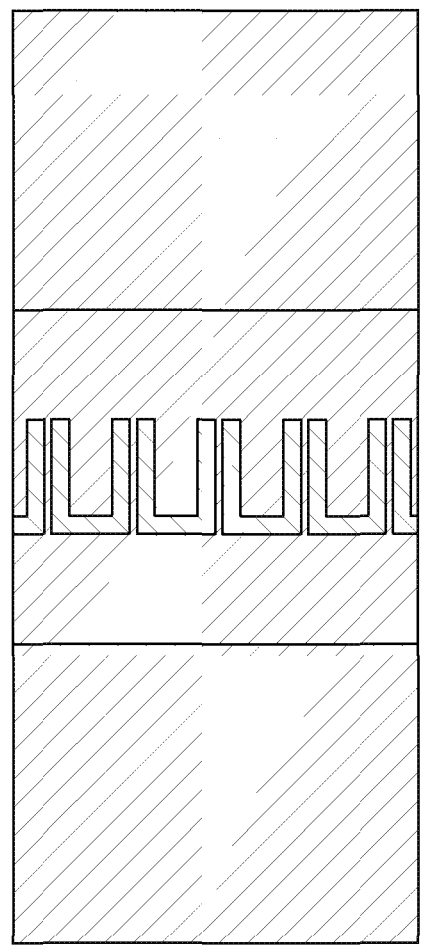

Next, the structure is processed further to remove the exposed portions of semiconductor material, forming insulative features, each of which completely interrupts the layer of semiconductor material such that current cannot flow across an insulative feature. The resultant structure is shown in FIGS. 19g (cross section) and 19h (top view).

Figure 19I:
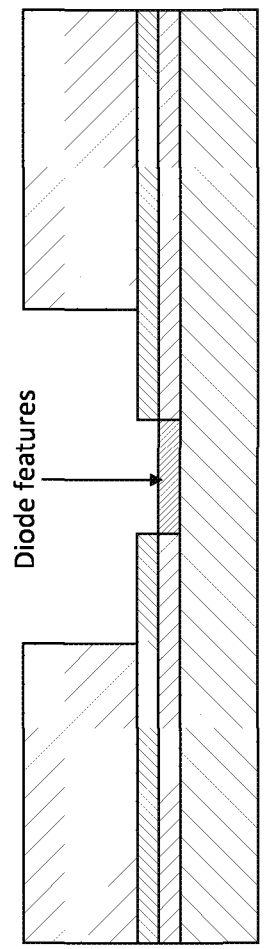
Figure 19J:
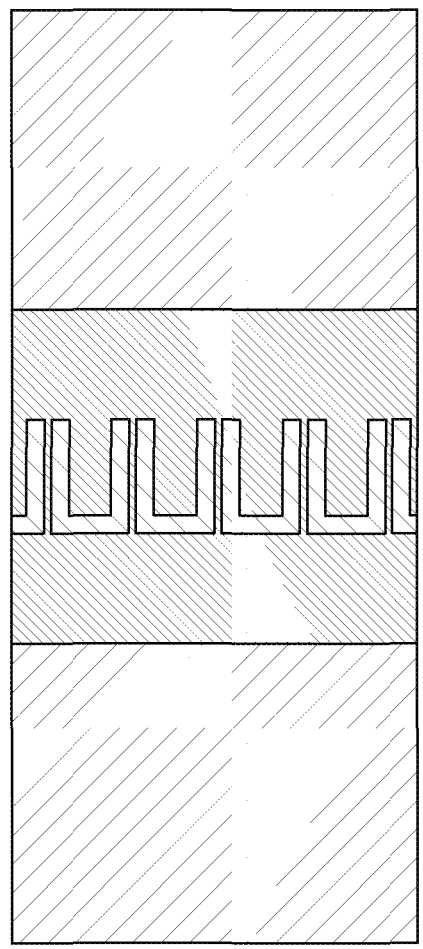

Next, the structure is processed to remove yet more resist material, until the second region R2 is completely removed, exposing portions of the conductor layer adjacent the insulative features, yet leaving other portions of the conductor layer still covered by the remaining resist material of the third region R3. The resultant structure is shown in FIGS. 19*i* (cross section) and 19*j* (top view).

Figure 19K:
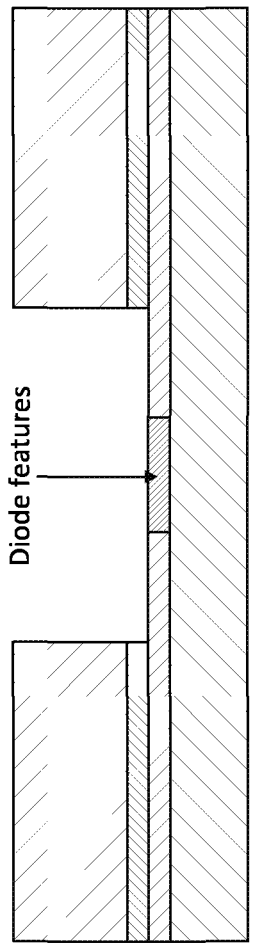
Figure 19L:
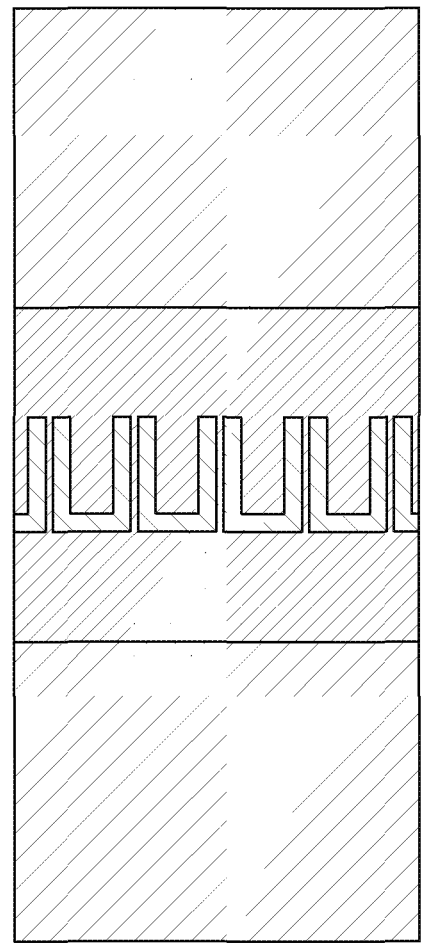

That structure is then processed further to remove the exposed portions of conductor layer 5, yielding the structure shown in FIGS. 19*k* (cross section) and 19*l* (top view).

Figure 19M:
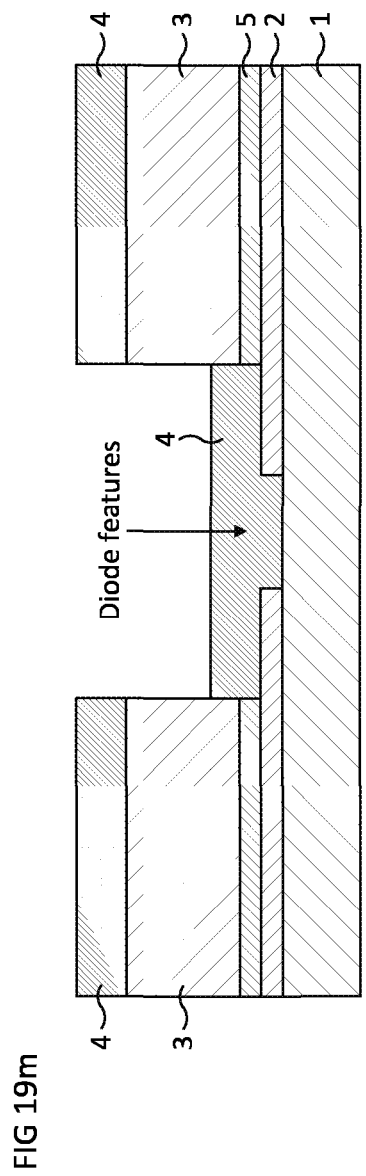
Figure 19N:
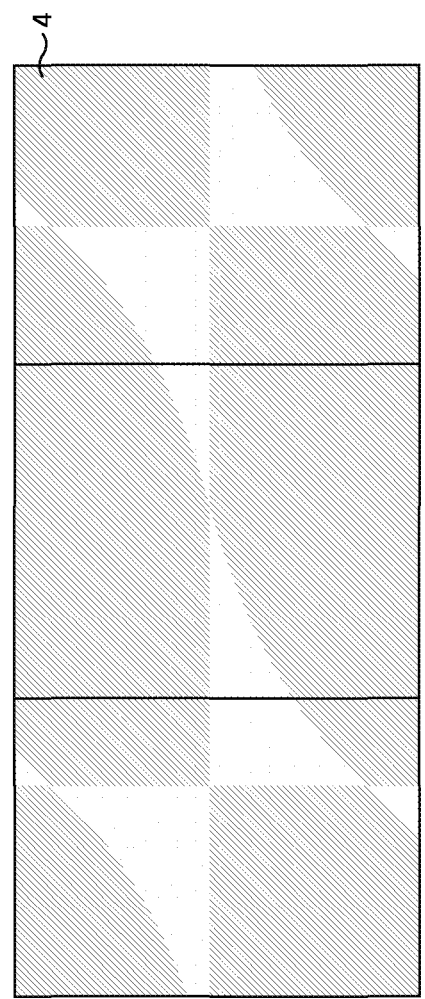

A layer of dielectric material 4 is then formed over the structure of FIGS. 19*k* and *l*, yielding the structure of FIGS. 19*m* (cross section) and 19*n* (top view).

Next, the remaining resist material 3 of the third region R3 is removed (for example by a lift-off technique), yielding the structure shown in FIGS. 19*o* (cross section) and 19*p* (top view). The structure comprises a first device terminal which itself comprises a portion 52 of conductor layer and an underlying portion 22 of semiconductor layer, and a second terminal comprising a portion 53 of conductor layer, and an underlying portion 23 of semiconductor layer.

Figure 20A:
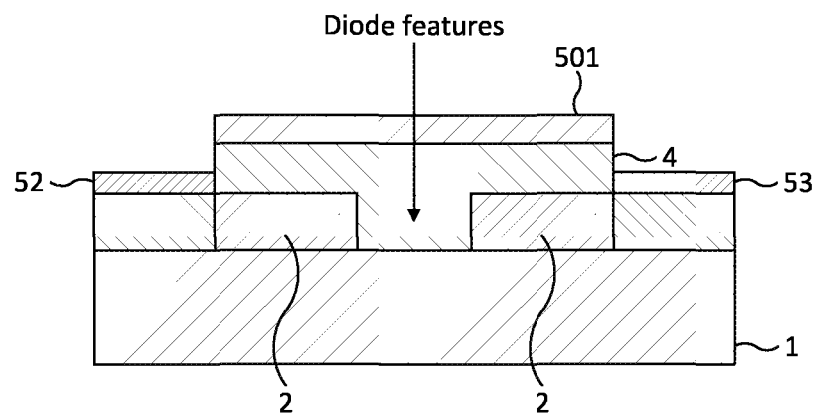
FIG. 20 illustrates a step in another method of manufacturing an electronic device embodying the invention.
Figure 20B:
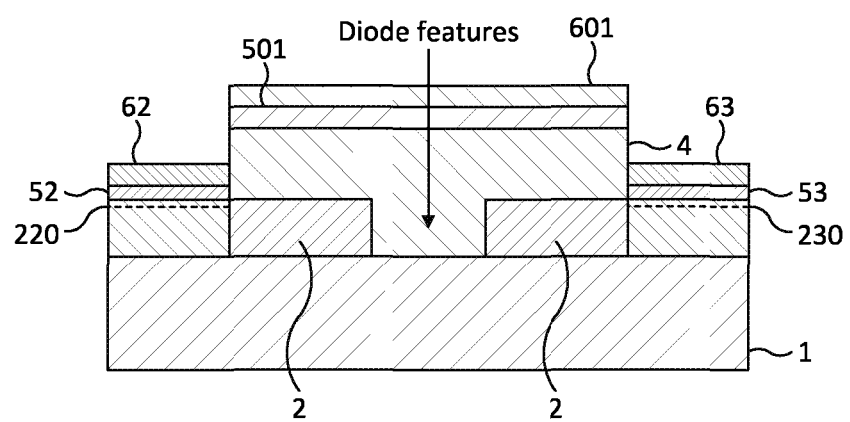
Figure 21A:
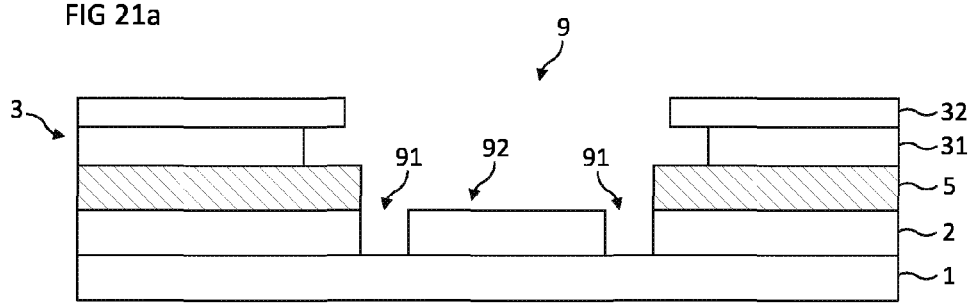
FIG. 21 illustrates steps in another process to make a device embodying the invention.
Figure 21B:
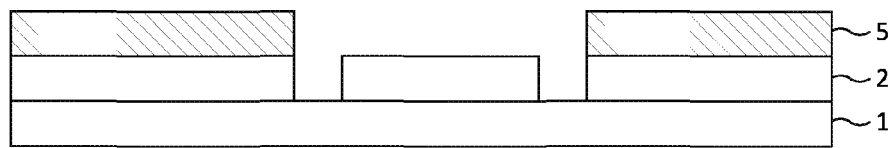
Figure 21C:
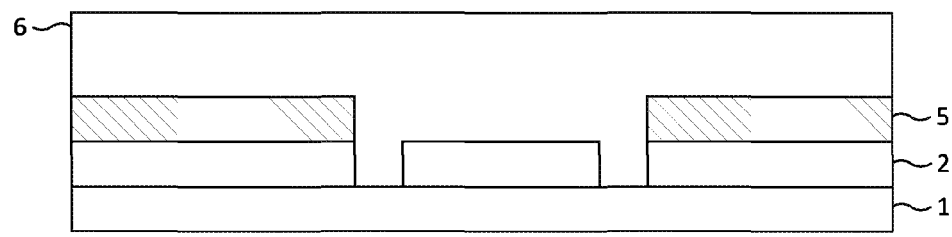
Figure 21D:
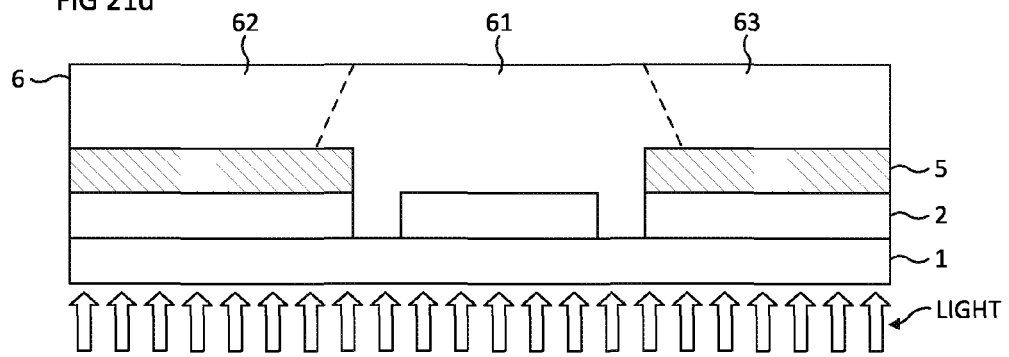
Figure 21E:
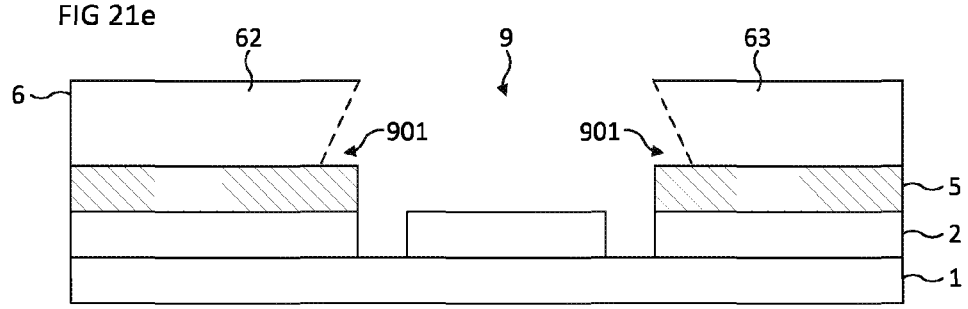
Figure 21F:
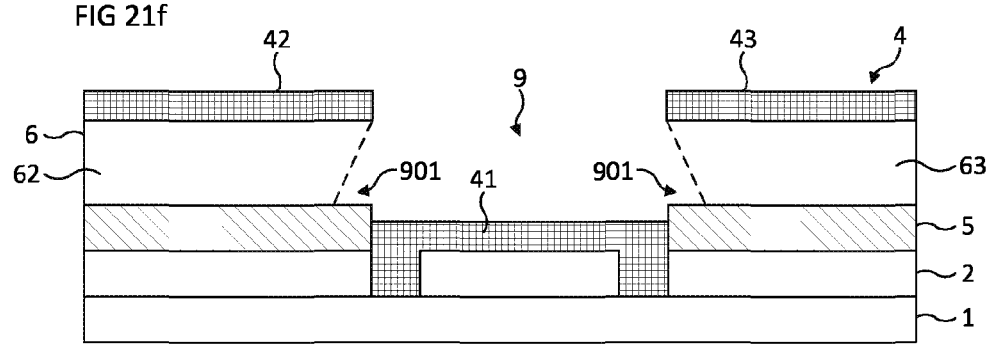
Figure 21G:
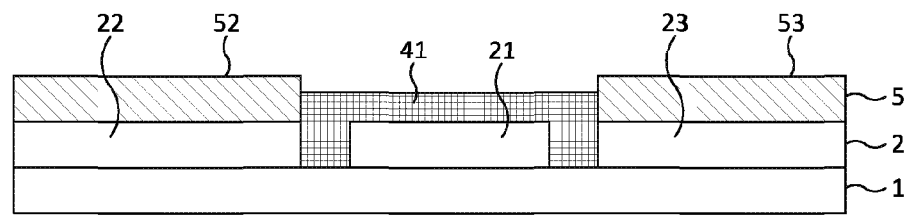
Figure 22A:
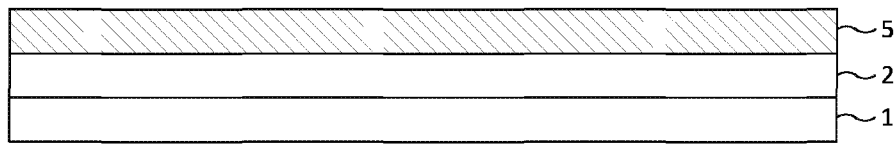
FIG. 22 illustrates steps in another process to make a device embodying the invention.
Figure 22B:
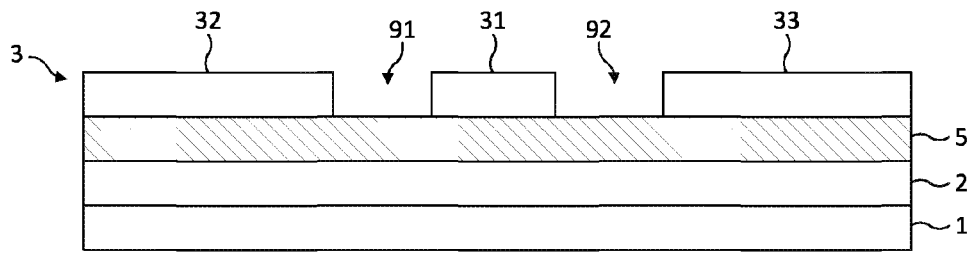
Figure 22C:
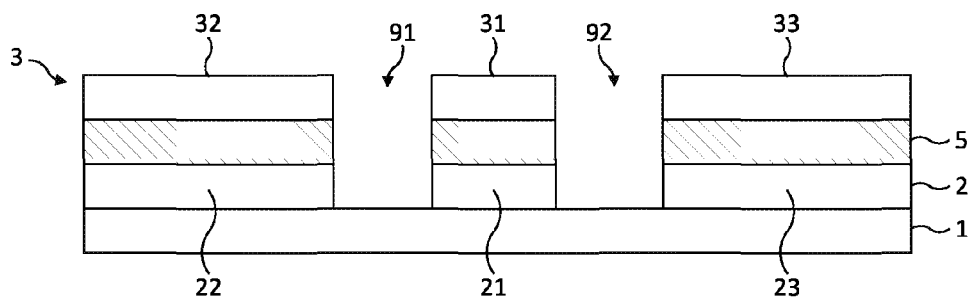
Figure 22D:
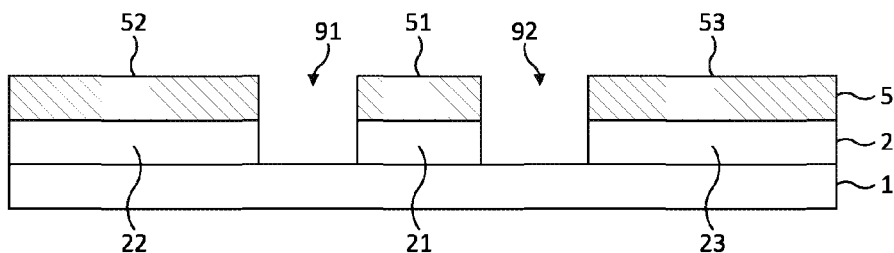
Figure 22E:
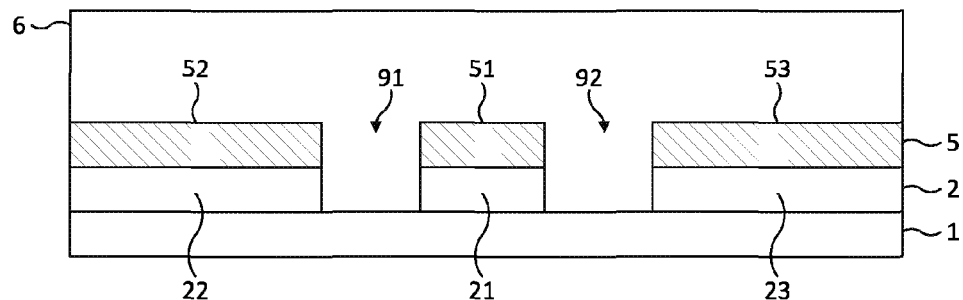
Figure 22F:
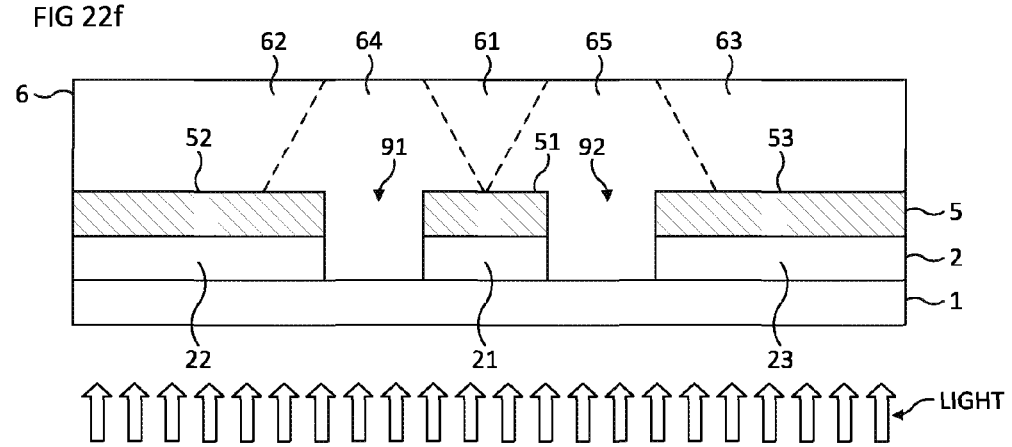
Figure 22G:
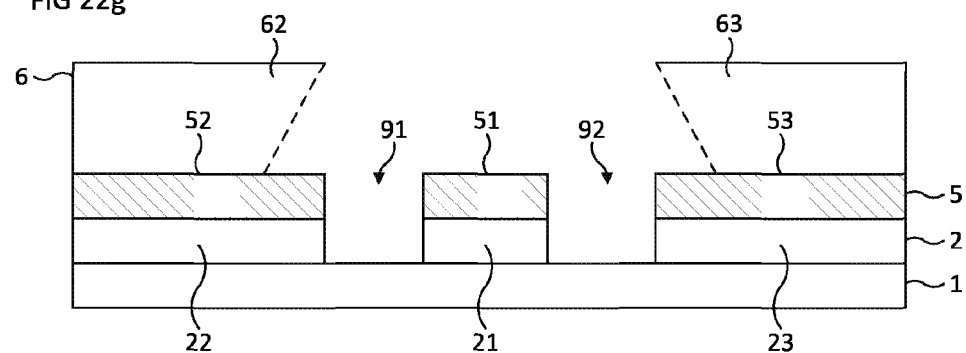
Figure 22H:
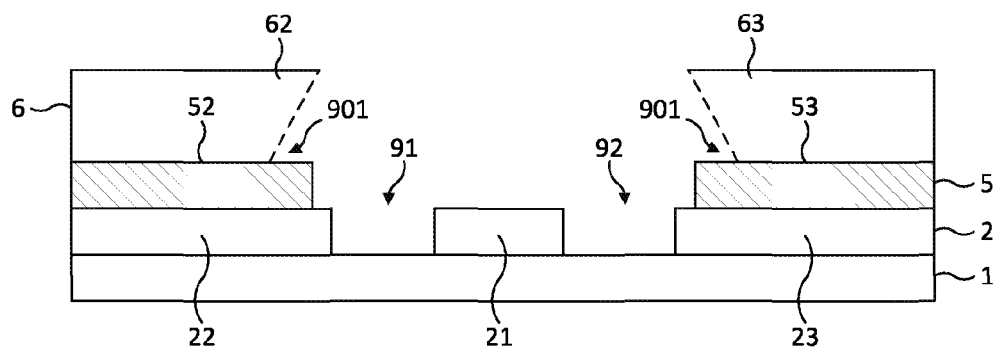
Figure 22I:
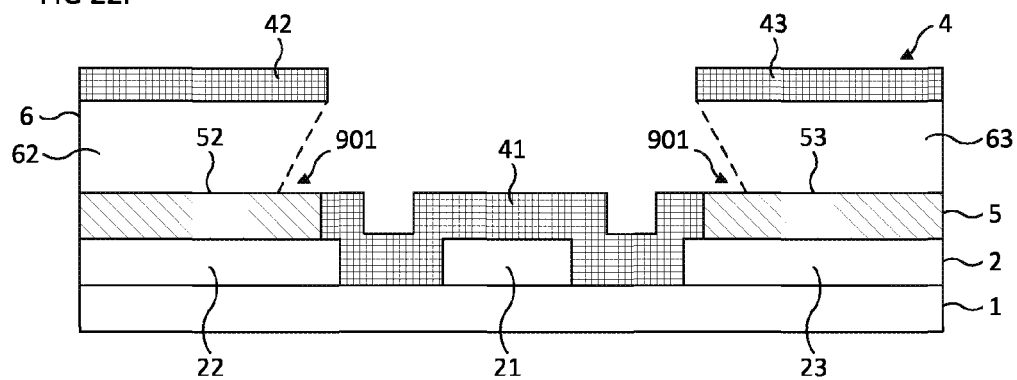
Figure 22J:
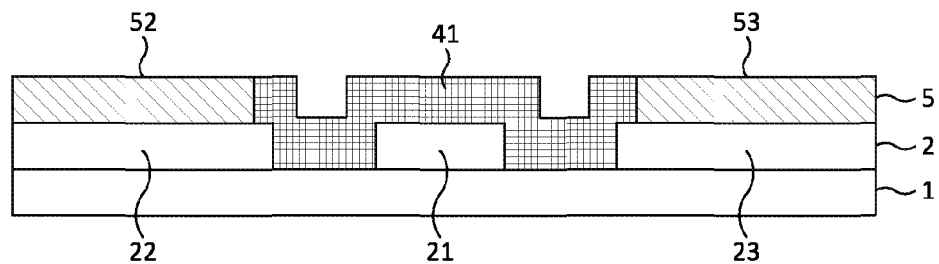

Referring now to FIG. 20, this is a schematic cross section of a structure undergoing a processing step in a method embodying the invention. The structure comprises a basic device structure as shown in FIG. 12*k* described above. Additionally, the structure comprises conductive regions 501, 52 and 53 formed over the dielectric layer 4 which covers the insulative features and certain portions of the underlying semiconductor layer 2. These conductive regions can be formed from a variety of materials, for example aluminium. In this instance the conductive regions are not connected and have been formed by a deposition method which is substantially anisotropic or "line-of-sight", e.g. evaporation. In other embodiments the conductive regions may be connected. In FIG. 20*a* conductive regions 501, 52 and 53 have been created. Conductive region 501 covers dielectric layer 4, which is protecting the insulative features of the diode. Conductive regions 52 and 53 cover regions of semiconductive layer 2, and form electrode regions. In certain embodiments this completes the device structure. In alternative embodiments the conductive material is reactive i.e. readily oxidises, e.g. aluminium or lithium, such that it removes or scavenges oxygen from other layers. In FIG. 20*b*, the thin-layer of conductive material in regions 52 and 53 has reacted with semiconductive layer 2, forming regions 220 and 230 at the surface of the semiconductive layer which have had oxygen removed. In the case of certain semiconductor materials, e.g. oxides, this increases the conductivity of the layer. The top-surface of the conductive regions 52, 53 and 501 have been exposed to air and become oxidised into thin insulating layers 601, 62 and 63. The oxidation may be enhanced by additional thermal or laser annealing. In some instances the conductive regions 52, 53 and 501 will become fully insulating, with the areas of semiconductive material 220 and 230 providing regions of high conductivity. The thickness of conductive regions 52, 53 and 501 is typically 0.5-10 nm, preferably 1-5 nm, most preferably 1-2 nm. The material for conductive regions 52, 53 and 501 is typically a reactive metal such as aluminium.

Referring now to FIG. 21, this is a schematic cross section of a structure undergoing a processing step in a method embodying the invention. The structure in FIG. 21*a* comprises a basic device structure as shown in FIG. 5*f* described above. In FIG. 21*b* the resist stack 3 has been removed by solvent lift-off. The structure of FIG. 21*b* in certain embodiments is produced using techniques as described above, in which a layer of resist material comprising regions having a plurality of different thicknesses is formed over the basic multilayer structure of substrate, semiconductor, and conductor. However, it will be appreciated that in alternative embodiments the structure shown in FIG. 21*b* may be produced using a variety of techniques, not limited to techniques involving the forming of resist or imprint layers over an initial multi-layer substrate-semiconductor-conductor structure. In FIG. 21*c* a layer of photoresist 6 has been deposited over the substrate. FIG. 21*d* shows a further stage where light has been directed from beneath substrate 1 to expose regions of photoresist 6. Conductive layer 5 is opaque to the light and acts as a mask to regions of photoresist which are directly deposited above. The exposure is controlled such that photoresist 6 is slightly overexposed, creating regions 61, 62 and 63. Regions 62 and 63 have not been exposed to the light, whereas region 61 has been exposed. The photoresist may also be underexposed in some embodiments. FIG. 21*e* shows a later stage after further processing and development of photoresist 6, such that region 61 is completely removed to create window 9. The exposure process has resulted in lips or undercuts 901 after development. FIG. 21*f* shows a further stage whereby dielectric 4 has been deposited over the substrate. Undercuts 901 have created discontinuation in layer 4. This has created regions 41, covering semiconductive layer 2 and regions 42 and 43 covering photoresist regions 62 and 63 respectively. FIG. 21*g* shows a final stage where remaining photoresist 6 has been removed along with dielectric regions 42 and 43. The final configuration consists of channel region 21 covered with dielectric region 41, contact regions 22, 23, 52 and 53.

Referring now to FIG. 22 this is a cross section of a structure undergoing a processing step in a method embodying the invention. In FIG. 22*a* there is a provided a transparent plastic substrate 1 (PEN), on which is deposited a 30 nm layer of semiconductor 2, gallium:indium:zinc oxide (GaInZnO$_4$) by pulsed-DC sputter deposition, and a 20 nm layer of conductive material 5, molybdenum by DC sputtering. In FIG. 22*b* a resist material 3, 150 nm PMMA, has been deposited over the substrate and patterned by e-beam to create windows 91 and 92, exposing the top-surface of conductive layer 5, and resist regions 31, 32 and 33. It will be appreciated that other techniques could have been used to create windows 91 and 92, such as laser-writing/ablation, cutting or imprinting. FIG. 22*c* shows a further stage where the exposed conductive layer 5 has been removed, in this instance using reactive ion-etching of Molybdenum ($CF_4$+ 10% $O_2$, 50 W, 50 mTorr). The then exposed semiconductive layer 2 has also been removed, in this instance by wet-etching of GIZO (0.05% wt oxalic acid, 60 s). The structure now consists of semiconductive regions 21, 22 and 23 respectively supporting conductive regions 51, 52 and 53 and resist regions 31, 32 and 33. FIG. 22*d* shows a further stage where resist material 3 has been removed by dissolving in acetone. In FIG. 22*e* a layer of photoresist 6 has been deposited over the substrate, in this instance positive resist which has then been baked. The substrate is then exposed to UV light from beneath substrate 1 to expose photoresist 6. Conductive layer 5 is opaque to UV light such that conductive regions 51, 52 and 53 act to partially shield photoresist 6. The resultant structure is shown in FIG. 22*f* where photoresist regions 61, 62, 63, 64 and 65 have been created. Regions 64 and 65 have been fully exposed to the UV light whereas 61, 62 and 63 have been substantially shielded or masked. Photoresist 6 has been somewhat overexposed and after development, regions 64 and 65 are removed and, due to the overexposure, region 61 is removed at the same time as shown in FIG. 22*g*. Conductive region 51 is now fully exposed whereas conductive regions 52 and 53 are still substantially covered by photoresist 6. Conductive region 51 is now removed by a low-energy reactive ion-etching of molybdenum ($CF_4$+10% $O_2$, 50 W, 300 mTorr), in the same process partially removing exposed areas of conductive regions 52 and 53, as shown in FIG. 22h. The photoresist exposure process also created undercuts or lips 901. A dielectric layer 4, in this instance reactive DC sputtering of aluminium oxide (50 nm), has been deposited over the substrate in FIG. 22i, creating regions 41, 42 and 43. Regions 42 and 43 are disconnected from region 41 due to undercuts 901. After solvent lift-off process to remove photoresist 6 (acetone), the dielectric regions 42 and 43 are removed. FIG. 22j shows the resultant structure with semiconductor (GIZO) channel region 21 covered by dielectric ($Al_2O_3$) region 41, contact regions comprised of semiconductive regions 22 and 23, supporting conductive regions 52 and 53.

In certain embodiments the etch selectivity is 1:1 and the resist lateral etch is much slower than the vertical etch. In certain embodiments, a 15 nanometer thick layer of Mo and a 50 nanometer layer of GIZO are employed. Thus, etching of 30 nanometers of Mo and 50 nanometers of GIZO is required in certain embodiments. The Mo etch can be achieved using $CF_4/O_2$ (or a wet-etch may be used such as Transene™ Moly Etch TFM). The GIZO etch can be achieved using $BCl_3/Cl_2$ (or a wet-etch may be used with oxalic acid). In certain embodiments the dielectric does not necessarily need to be lifted off in the same process. In certain embodiments, the method may utilise lamp or laser annealing to repair surface damage on the semiconductor.

The invention claimed is:

1. A method of manufacturing a substantially planar electronic device comprising a first terminal, a second terminal, and a semiconductor channel providing a current flow path via which current can flow from the first terminal to the second terminal, the method comprising:
    providing a first structure comprising a substrate, a layer of semiconductor material supported by the substrate, and a layer of conductor material covering the layer of semiconductor material;
    processing the first structure to form a second structure comprising said substrate, a first terminal region comprising a first portion of the layer of semiconductor material covered by a first portion of the layer of conductor material, a second terminal region comprising a second portion of the layer of semiconductor material covered by a second portion of the layer of conductor material, a third portion of the layer of semiconductor material providing a semiconductor channel connecting the first and second terminal regions, and a plurality of insulative features interrupting the layer of semiconductor material and defining at least a position of the semiconductor channel;
    forming a layer of photoresist material over the second structure to cover the first and second terminal regions, the third portion of the layer of semiconductor material providing the semiconductor channel, and the insulative features to form a third structure;
    exposing the third structure to electromagnetic radiation from a direction such that the first and second portions of the layer of conductor material act to shield overlying portions of the layer of photoresist material from the radiation;
    removing an exposed portion of the layer of photoresist material to form a window through said layer of photoresist material;
    depositing dielectric material at least within said window to form a layer of dielectric material filling the insulative features and covering, either directly or indirectly, the third portion of the layer of semiconductor material providing the semiconductor channel; and
    removing remaining material of the layer of photoresist material to expose the first and second portions of the layer of conductor material, the first and second portions of the layer of conductor material providing the first and second terminals respectively and being separated from each other in at least one area by the layer of dielectric material.

2. An electronic device in accordance with claim 1, the device comprising a semiconductor channel, a dielectric layer covering the channel, and a layer of hydrophobic material covering the dielectric layer.

3. The electronic device in accordance with claim 2, wherein the electronic device is connected within an electronic circuit.

* * * * *